(12) United States Patent
Zhu et al.

(10) Patent No.: US 11,929,304 B2
(45) Date of Patent: Mar. 12, 2024

(54) SEMICONDUCTOR APPARATUS WITH HEAT DISSIPATION CONDUIT IN SIDEWALL INTERCONNECTION STRUCTURE, METHOD OF MANUFACTURING THE SAME, AND ELECTRONIC DEVICE

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 111 days.

(21) Appl. No.: 17/666,790

(22) Filed: Feb. 8, 2022

(65) Prior Publication Data

US 2022/0254702 A1    Aug. 11, 2022

(30) Foreign Application Priority Data

Feb. 9, 2021    (CN) .......................... 202110181463.2

(51) Int. Cl.
*H01L 23/46*    (2006.01)
*H01L 21/48*    (2006.01)

(52) U.S. Cl.
CPC .......... *H01L 23/46* (2013.01); *H01L 21/4871* (2013.01)

(58) Field of Classification Search
CPC . H01L 23/46; H01L 21/4871; H01L 25/0652; H01L 27/0688
(Continued)

(56) References Cited

U.S. PATENT DOCUMENTS

| | | | |
|---|---|---|---|
| 2007/0117306 A1 | 5/2007 | Oyamatsu | |
| 2013/0020618 A1* | 1/2013 | Zhong | ................... H01L 23/473 257/288 |
| 2019/0122951 A1* | 4/2019 | Chen | ................. H01L 23/49827 |

FOREIGN PATENT DOCUMENTS

| | | |
|---|---|---|
| CN | 101366115 A | 2/2009 |
| CN | 107887387 A | 4/2018 |

(Continued)

*Primary Examiner* — Quoc D Hoang
(74) *Attorney, Agent, or Firm* — Christensen, Fonder, Dardi & Herbert PLLC

(57) ABSTRACT

A semiconductor apparatus with a heat dissipation conduit in a sidewall interconnection structure, a method of manufacturing the semiconductor apparatus, and an electronic device including the semiconductor apparatus. According to the embodiments, the semiconductor apparatus includes: a carrier substrate having a first region and a second region adjacent to each other; a semiconductor device on the first region; and an interconnection structure on the second region, wherein the interconnection structure includes: an electrical isolation layer; a conductive structure in the electrical isolation layer, wherein at least a part of components require to be electrically connected in the semiconductor device is in contact with and therefore electrically connected to the conductive structure in a lateral direction, wherein the conductive structure is located at a corresponding height in the interconnection structure; and a heat dissipation conduit in the electrical isolation layer.

24 Claims, 27 Drawing Sheets

(58) Field of Classification Search
USPC .......................................................... 257/712
See application file for complete search history.

(56) References Cited

FOREIGN PATENT DOCUMENTS

| | | |
|---|---|---|
| CN | 109449121 A | 3/2019 |
| FR | 2 982 074 A1 | 5/2013 |

* cited by examiner

SEMICONDUCTOR APPARATUS WITH HEAT DISSIPATION CONDUIT IN SIDEWALL INTERCONNECTION STRUCTURE, METHOD OF MANUFACTURING THE SAME, AND ELECTRONIC DEVICE

CROSS REFERENCE

This application claims the benefit of Chinese Patent Application No. 202110181463.2 filed on Feb. 9, 2021 in the China National Intellectual Property Administration, the entire disclosure of which is incorporated herein by reference.

TECHNICAL FIELD

The present disclosure relates to a field of semiconductors, in particular to a semiconductor apparatus with a heat dissipation conduit in a sidewall interconnection structure, a method of manufacturing the semiconductor apparatus, and an electronic device including the semiconductor apparatus.

BACKGROUND

With a continuous miniaturization of a semiconductor apparatus, it is increasingly difficult to manufacture a high-density interconnection structure because it is difficult to reduce a dimension in a lateral direction. In addition, in order to increase an integration level, multilayer devices may be stacked. It is desired to provide an interconnection for such stacked devices in a flexible manner.

In addition, a heat dissipation becomes a problem in a high-density device.

SUMMARY

In view of the above, an object of the present disclosure is at least in part to provide a semiconductor apparatus with a heat dissipation conduit in a sidewall interconnection structure, a method of manufacturing the semiconductor apparatus, and an electronic device including the semiconductor apparatus.

According to an aspect of the present disclosure, a semiconductor apparatus is provided, including: a carrier substrate having a first region and a second region adjacent to each other; a semiconductor device on the first region; and an interconnection structure on the second region, wherein the interconnection structure comprises: an electrical isolation layer; a conductive structure in the electrical isolation layer, wherein at least a part of components require to be electrically connected in the semiconductor device is in contact with and therefore electrically connected to the conductive structure in a lateral direction, wherein the conductive structure is located at a corresponding height in the interconnection structure; and a heat dissipation conduit in the electrical isolation layer.

According to another aspect of the present disclosure, a method of manufacturing a semiconductor apparatus, comprising: providing a device stack on a carrier substrate; forming, in a region adjacent to the device stack on the carrier substrate, an interconnection structure laterally adjacent to the device stack, wherein the interconnection structure comprises an electrical isolation layer and a conductive structure in the electrical isolation layer, and a height of the conductive structure in the interconnection structure is controlled in forming the interconnection structure, so that at least a part of components require to be electrically connected in the device stack is in contact with and therefore electrically connected to the conductive structure in a lateral direction, and the conductive structure is located at a corresponding height in the interconnection structure; and forming a heat dissipation conduit in the electrical isolation layer.

According to another aspect of the present disclosure, an electronic device is provided, including the semiconductor apparatus described above.

BRIEF DESCRIPTION OF THE DRAWINGS

The above and other objectives, features and advantages of the present disclosure will be more apparent through the following descriptions of embodiments of the present disclosure with reference to the accompanying drawings.

FIG. 1 to FIG. 37 schematically show some stages in a process of manufacturing a semiconductor apparatus, in particular an interconnection structure therein, according to the embodiments of the present disclosure, in which FIG. 2(A) (in which positions of line AA' and line BB' are shown), FIG. 2(B), FIG. 3(A), FIG. 4(A), FIG. 5(A), FIG. 12, FIG. 16(A) (in which positions of line CC' and line DD' are shown), and FIG. 17(A) are top views;

FIG. 1, FIG. 2(C), FIG. 5(B), FIG. 6 to FIG. 11, and FIG. 13 to FIG. 15 are sectional views taken along line AA';

FIG. 16(B), FIG. 17(B), FIG. 18(A), FIG. 19, FIG. 20(A), FIG. 21 to FIG. 27, FIG. 28(A), FIG. 34(B), and FIG. 36(B) are sectional views taken along line CC';

FIG. 16(C), FIG. 17(C), FIG. 18(B), FIG. 20(B), FIG. 28(B), FIG. 29 to FIG. 33, FIG. 34(A), FIG. 35, FIG. 36(A), and FIG. 37 are sectional views taken along line DD'.

Throughout the accompanying drawings, the same or similar reference numerals indicate the same or similar components.

DETAILED DESCRIPTION OF EMBODIMENTS

Figure 1:
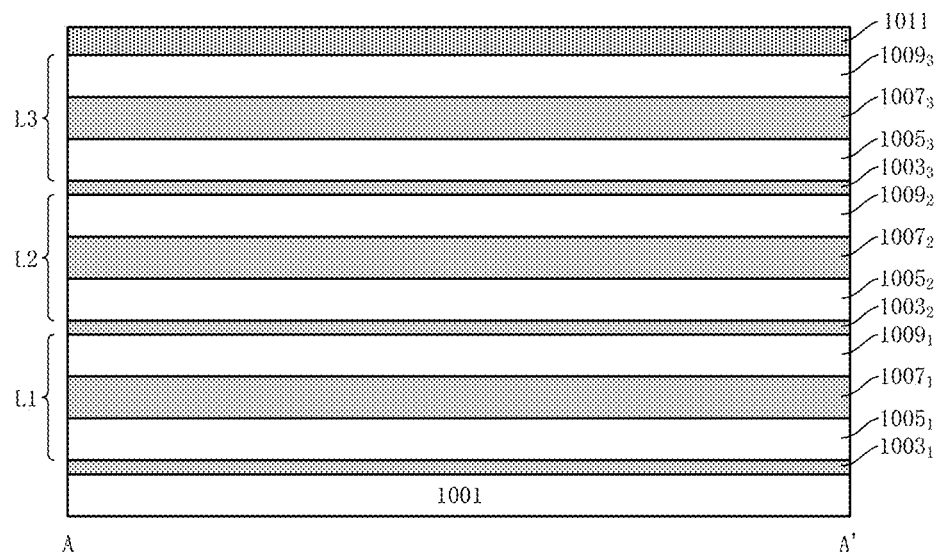

The embodiments of the present disclosure will be described below with reference to the accompanying drawings. It should be understood, however, that these descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to the embodiments of the present disclosure are shown in the accompanying drawings. The drawings are not drawn to scale. Some details are enlarged and some details may be omitted for clarity of presentation. Shapes of various regions and layers as well as the relative size and positional relationship thereof shown in the drawings are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being "on" another layer/element, the layer/element may be directly on the another layer/element, or there may be an intermediate layer/element between them. In addition, if a layer/element is located "on"

another layer/element in one orientation, the layer/element may be located "under" the other layer/element when the orientation is reversed.

According to the embodiments of the present disclosure, there is provided a semiconductor apparatus with a sidewall interconnection structure. Here, the "sidewall" interconnection structure refers to that the interconnection structure is formed in a lateral direction (e.g., in a direction substantially parallel to a surface of a substrate) of a device requires to be interconnected, and thus may be interconnected to the device (e.g., a component requires to be interconnected in the device, such as a source/drain layer or a source/drain region formed therein, a gate electrode, etc.) through a sidewall of the device. Due to a difference in a height and/or an orientation of the components require to be interconnected, conductive structures interconnected to these components may be formed on the sidewalls of these components, respectively.

For example, in a planar device such as a planar Metal Oxide Semiconductor Field Effect Transistor (MOSFET), a gate electrode is arranged on an active region, so that the gate electrode and the active region (especially source/drain regions therein) may be located at different heights (with respect to a substrate on which the device is formed). Therefore, the source/drain regions may be connected to a conductive structure (e.g., an interconnection line and/or a via hole) at a first height in the interconnection structure, and the gate electrode may be connected to a conductive structure at a second height higher than the first height in the interconnection structure. On the other hand, the source/drain regions may be located on two opposite sides of the gate electrode (referred to as "a first side" and "a second side"). Then, the source/drain regions may be connected to the corresponding conductive structure in the interconnection structure on the first side and/or the second side. Generally, on the first side and the second side of the device, a sidewall of the gate electrode is recessed inwardly with respect to a sidewall of the source/drain region, so that the gate electrode may be connected to the corresponding conductive structure in the interconnection structure on a third side and/or a fourth side.

Similarly, in a vertical device, a source/drain layer or a source/drain region formed therein and the gate electrode are stacked in a vertical direction, and thus may be located at different heights. Therefore, an interconnection to the vertical device may be achieved through the conductive structures at different heights in the interconnection structure.

For example, the vertical device may include an active region arranged vertically (e.g., in a direction substantially perpendicular to a surface of a substrate) on the substrate, which may include, for example, a first source/drain layer, a channel layer, and a second source/drain layer stacked in the vertical direction. The channel layer may be a vertical nanosheet or nanowire. A source/drain region may be formed in the first source/drain layer and the second source/drain layer, and a channel region may be formed in the channel layer. The channel layer may contain a single crystal semiconductor material. Certainly, the source/drain layer may also contain a single crystal semiconductor material. For example, they may both be formed by an epitaxial growth. The vertical device may further include a gate electrode arranged on an outer periphery of the channel layer, and the gate electrode may surround the outer periphery of the channel layer. Therefore, the device according to the embodiments of the present disclosure may be a surrounding-gate device. According to the embodiments of the present disclosure, the gate electrode may be self-aligned to the channel layer. For example, at least a part of the gate electrode on a side close to the channel layer may be substantially coplanar with the channel layer. For example, said part of the gate electrode may be substantially coplanar with an upper surface and/or a lower surface of the channel layer.

Devices may be stacked to form a device stack, so as to increase an integration density. A plurality of device stacks may be arranged on the substrate. The interconnection structure may be formed between the device stacks, so as to electrically connect devices require to be interconnected within or between the device stacks. More specifically, at a position in which the interconnection structure is adjacent to the component requires to be electrically connected, (a side wall of) the conductive structure in the interconnection structure is exposed and (a side wall of) the component is also exposed, so that the two may be in contact with and therefore electrically connected to each other. An observable interface may exist between the interconnection structure and the device. To achieve an interconnection in all directions, the interconnection structure may surround each device stack. Certainly, a part of the device stacks may be provided with the interconnection structure only on the sidewall requires to be electrically connected.

For ease of layout, the device stacks may be arranged in a first direction and a second direction intersecting (e.g., perpendicular to) the first direction, so as to form an array. Then, the interconnection structure may extend in the first direction and the second direction between the device stacks and therefore may be adjacent to the device stacks in the first direction and the second direction.

The interconnection structure may include a conductive structure, such as an interconnection line and a via hole, arranged in an electrical isolation layer (e.g., a dielectric layer). For example, the interconnection structure may include an interconnection line layer and a via hole layer arranged alternately. A interconnection line may be provided in the interconnection line layer to achieve an interconnection in one same layer, and a via hole may be provided in the via hole layer to achieve an interconnection between different layers. The interconnection line may include a body portion extending in the corresponding interconnection line layer and a barrier layer surrounding the body portion.

In order to enhance a heat dissipation performance, a heat dissipation conduit may be formed in the electrical isolation layer. The heat dissipation conduit may extend from an inside of the electrical isolation layer to an outside, so as to dissipate an internal heat to the outside. The heat dissipation conduit may be in communication with an external coolant source, so that a coolant such as a gas and/or a liquid may be guided to flow through the heat dissipation conduit, so as to dissipate heat more efficiently. The heat dissipation conduit may be provided in various shapes. For example, the heat dissipation conduit may be a conduit such as a U-shaped conduit, with two ends open, so as to facilitate the coolant to flow through the heat dissipation conduit.

The semiconductor apparatus may be manufactured as follows. For example, a device stack in which a plurality of semiconductor device layers are stacked may be provided on a carrier substrate. A device in the device stack (e.g., a component requires to be electrically connected in the device) may be exposed on a sidewall of the stack. An interconnection structure laterally adjacent to the device stack may be formed in a region adjacent to the device stack on the carrier substrate, so as to be interconnected to (the component requires to be electrically connected) the device exposed on the sidewall of the device stack.

The conductive structure in the interconnection structure may be formed in layers, so as to be connected to devices at different heights. For example, an interconnection line may be formed on said region. A dielectric material may be further formed to bury the interconnection line, and a via hole may be formed in the dielectric material. By repeatedly performing such an operation multiple times, an interconnection structure including a plurality of layers of interconnection lines and a plurality of layers of via holes may be formed. A height of the interconnection line and a height of the via hole may be controlled through a formation height of the dielectric material.

The heat dissipation conduit may be embedded in the interconnection structure. A hole may be opened firstly and then the heat dissipation conduit may be dug through the hole. The hole may be relatively small to facilitate a closure. A vertically extended conduit may be formed through the hole by directly etching downward. The hole may be closed because the hole plus the vertically extended conduit has a large aspect ratio. A laterally extended conduit may be formed through the hole by selectively etching a structure (e.g., a dummy conductive structure) with an etching selectivity below the hole. The hole may form a "bottleneck" with respect to the laterally extended conduit, so that the hole may be closed.

The present disclosure may be presented in various forms, some examples of which will be described below. In the following descriptions, a selection of various materials is involved. In the selection of materials, in addition to a function of the material (for example, a semiconductor material may be used to form the active region, a dielectric material may be used to form an electrical isolation, and a conductive material may be used to form the interconnection line and the via hole), the etching selectivity is also considered. In the following descriptions, a required etching selectivity may or may not be indicated. It should be clear to those skilled in the art that when it is mentioned below that a material layer is etched, if it is not mentioned or shown that other layers are also etched, then the etching may be selective, and the material layer may have an etching selectivity relative to other layers exposed to a same etching recipe.

FIG. 1 to FIG. 37 schematically show some stages in a process of manufacturing a semiconductor apparatus, in particular an interconnection structure therein, according to the embodiments of the present disclosure.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. The bulk Si substrate such as a silicon wafer is illustrated below by way of example.

On the substrate 1001, a sacrificial layer $1003_1$ for defining an isolation layer, a first source/drain layer $1005_1$ for defining a lower source/drain region, a channel defining layer $1007_1$ for defining a channel region, and a second source/drain layer $1009_1$ for defining an upper source/drain region may be formed, for example, by an epitaxial growth. The first source/drain layer $1005_1$, the channel defining layer $1007_1$ and the second source/drain layer $1009_1$ may then define an active region of the device, and may be referred to as a "device layer", which is denoted by L1.

The sacrificial layer $1003_1$ may then be replaced with an isolation layer for isolating the device from the substrate, the sacrificial layer may have a thickness corresponding to a desired thickness of the isolation layer, for example, about 10 nm to 20 nm. According to a circuit design, the sacrificial layer $1003_1$ may not be provided. The first source/drain layer $1005_1$ and the second source/drain layer $1009_1$ may then be doped (or doped in situ when growing) to form the source/drain region, and the source/drain region may have a thickness of, for example, about 20 nm to 50 nm. The channel defining layer $1007_1$ may define a gate length and may have a thickness corresponding to a desired gate length of, for example, about 15 nm to 100 nm. Taking into account the following process of replacing the sacrificial layer $1003_1$ with the isolation layer, the thickness of the channel defining layer $1007_1$ here may be greater than the thickness of the sacrificial layer $1003_1$, which will be described in further detail below.

Each layer grown on the substrate 1001 may be a single crystalline semiconductor layer, and there may be etching selectivity between adjacent layers. For example, the sacrificial layer $1003_1$ may contain SiGe (an atomic percentage of Ge is, for example, about 10% to 30%, preferably 15%), the first source/drain layer $1005_1$ may contain Si, the channel defining layer $1007_1$ may contain SiGe (the atomic percentage of Ge is, for example, about 10% to 30%, preferably 15%), and the second source/drain layer $1009_1$ may contain Si.

In order to increase an integration density, a plurality of device layers may be provided. For example, a device layer L2 and a device layer L3 may be sequentially provided on the device layer L1 by epitaxial growth, and the device layers may be respectively separated from each other by sacrificial layers $1003_2$ and $1003_3$ for defining the isolation layers. According to the circuit design, the isolation layer may not be provided between some device layers. Similarly, the device layer L2 may include a first source/drain layer $1005_2$, a channel defining layer $1007_2$, and a second source/drain layer $1009_2$. The device layer L3 may include a first source/drain layer $1005_3$, a channel defining layer $1007_3$, and a second source/drain layer $1009_3$. Corresponding layers in each device layer may have the same or similar thickness and/or material, or may have different thicknesses and/or materials. In particular, the channel defining layers in different device layers may have different thickness, so that an electrical property of a resulting device may be adjusted. Here, for ease of description only, it is assumed that the device layers L1, L2 and L3 have the same configuration.

On the layers formed on the substrate 1001, a hard mask layer 1011 may be provided for ease of patterning. For example, the hard mask layer 1011 may contain a nitride (e.g., silicon nitride) and may have a thickness of about 50 nm to 200 nm.

Next, the active region may be defined in the device layers.

Figure 2A:
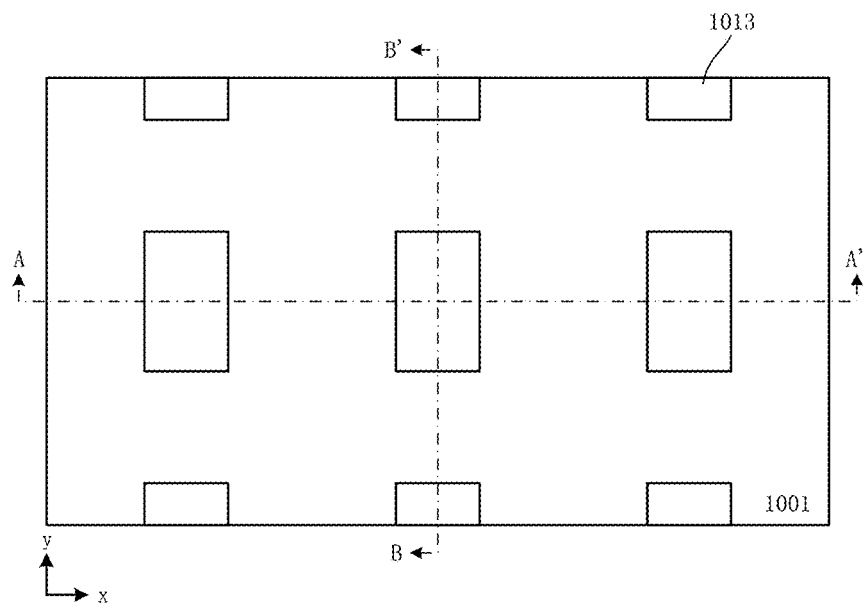
Figure 2B:
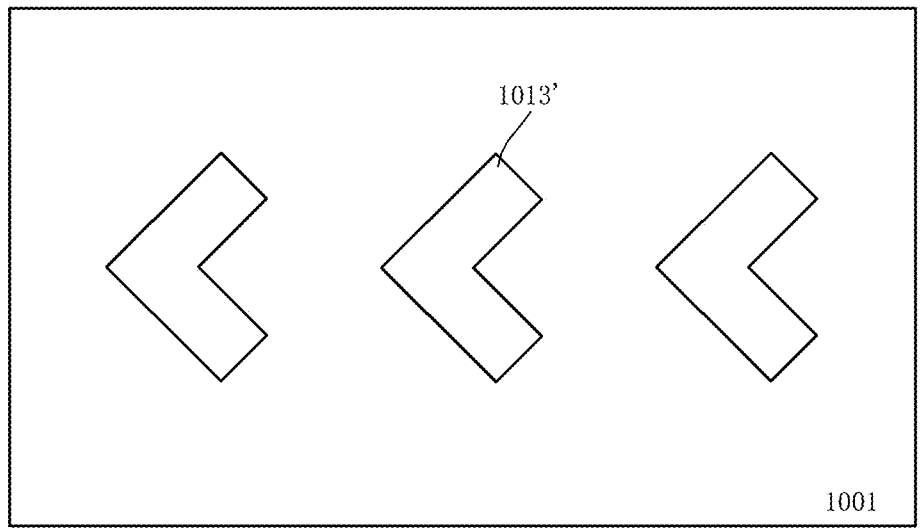

For example, as shown in FIG. 2(A), a photoresist 1013 may be formed on the hard mask layer 1011 and may be patterned into a shape of the active region by photolithography. In the example of FIG. 2(A), the photoresist 1013 is patterned in the form of an array arranged in a x-direction and a y-direction, and each element in the array is substantially in a shape of a rectangle (which may be a column to define the active region of an individual device), such as a rectangle with a short side in the x-direction and a long side in the y-direction. Certainly, the present disclosure is not limited to this. The photoresist 1013 may be patterned into various suitable shapes. For example, as shown in FIG. 2(B), in order to prevent a columnar active region from collapsing during manufacturing, the element in the array may be in a zigzag shape. For convenience, the case shown in FIG. 2(A) is illustrated by way of example in the following descriptions.

Figure 2C:
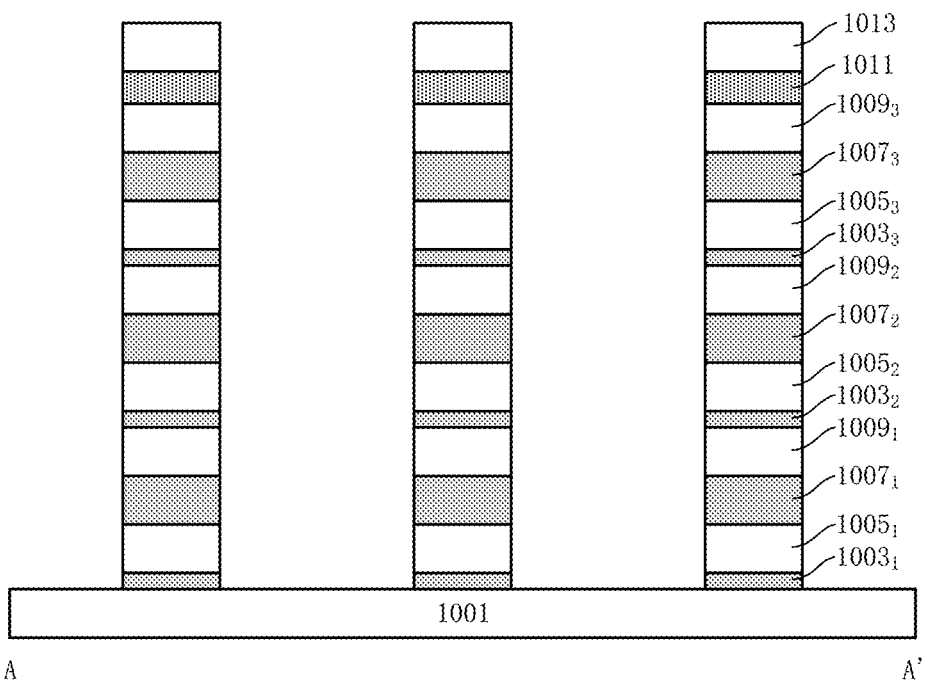

Each layer on the substrate 1001 may be sequentially etched by selective etching such as Reactive Ion Etching (RIE) with the patterned photoresist 1013 as an etching mask. The RIE may be performed in a substantially vertical direction (e.g., a direction perpendicular to a surface of the substrate) and may stop on the surface of the substrate 1001. Thus, as shown in FIG. 2(C), an array of a series of columns is left on the substrate 1001. Each column may define active regions of a plurality of (which is three in this example) vertical devices stacked on top of each other. In a top view, each column may exhibit a rectangular shape as shown in FIG. 2(A) or a zigzag shape as shown in FIG. 2(B). After that, the photoresist 1013 may be removed.

The following device manufacture may be performed on the basis of the active regions. Taking into account a requirement of the following process, such as a control of a topography of the channel layer, a shielding material may be formed around the column. During a manufacture process, one or more sides of the active region may be exposed for processing, while another side or sides of the active region may be shielded by the shielding material. The shielding material may further support an elongate column during the manufacture process, particularly during the process of replacing the sacrificial layer with the isolation layer, so as to prevent a collapse of the elongate column.

Figure 3A:
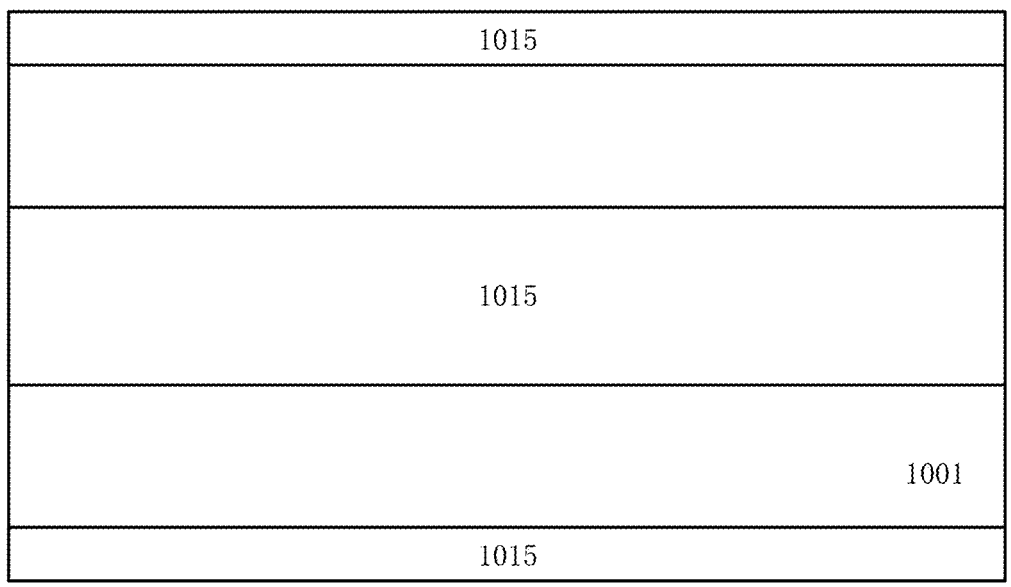
Figure 3B:
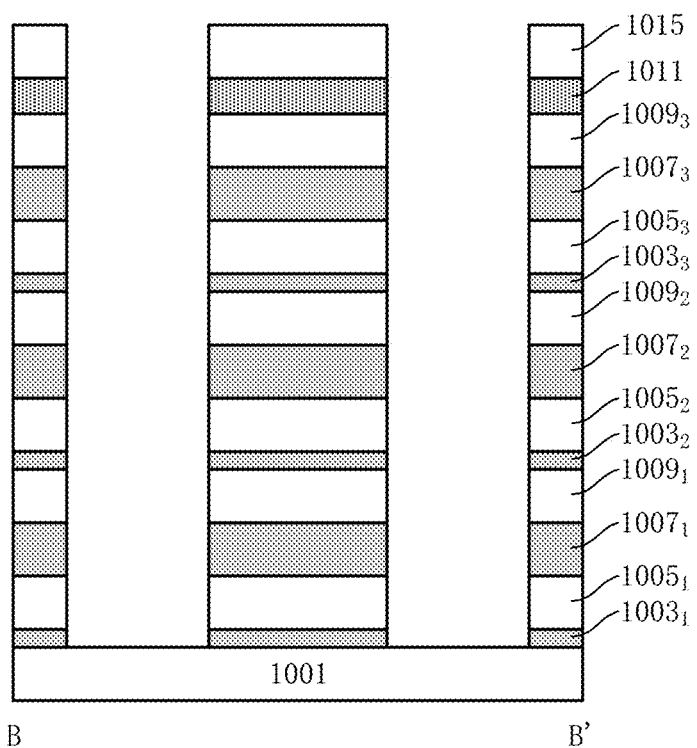
FIG. 3(B), FIG. 4(B) and FIG. 5(C) are sectional views taken along line BB.
Figure 4A:
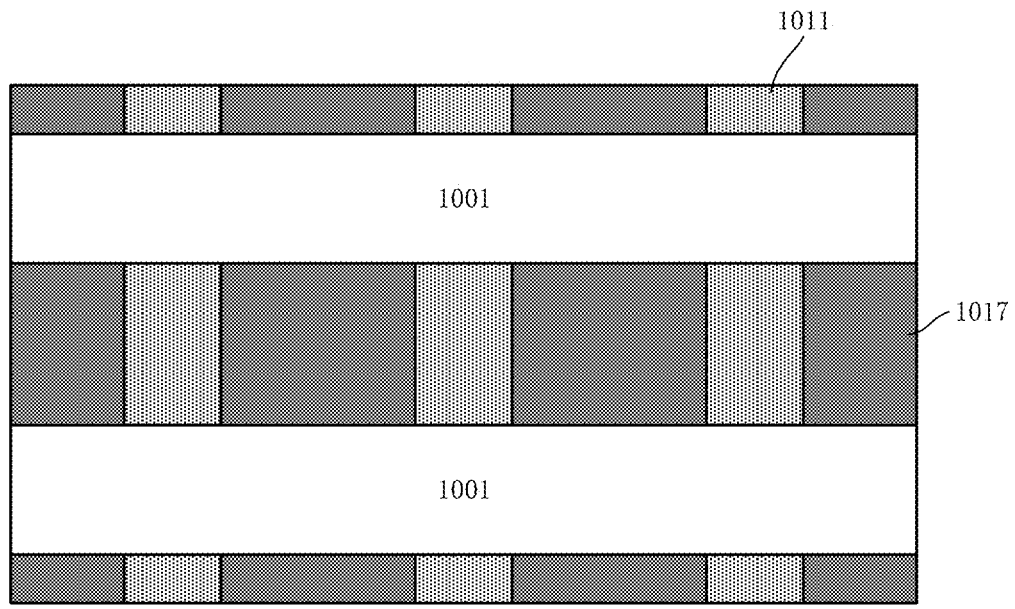

For example, as shown in FIG. 3(A) and FIG. 3(B), the shielding material (referring to 1017 in FIG. 4(A)) may be formed on the substrate 1001 by, for example, deposition. Taking into account an etching selectivity (for example, with respect to the hard mask layer 1011 such as a nitride and a subsequently formed position retaining layer such as an oxide (e.g., silicon oxide)), the shielding material 1017 may contain SiC. A planarization process such as a Chemical Mechanical Polishing (CMP) may be performed on the deposited shielding material 1017, and the CMP may stop on the hard mask layer 1011. Then, each column may be surrounded by the shielding material 1017.

Here, in order to control a length of the subsequently formed channel layer in the y-direction and a topography of an end portion of the channel layer in the y-direction, two opposite sides of the active region in the y-direction may be processed firstly. Thus, the two sides need to be exposed. To this end, a photoresist 1015 may be formed on the hard mask layer 1011 and the shielding material 1017, and may be patterned to expose at least opposite sides of each column in the y-direction. For example, the photoresist 1015 may include an opening extending in the x-direction between the columns. The patterned photoresist 1015 may be used as an etching mask to etch the shielding material 1017 by selective etching such as RIE. The RIE may be performed in the substantially vertical direction and may stop on the surface of the substrate 1001. Then, a sidewall of each column in the y-direction may be exposed (referring to FIG. 3 (B)), while a sidewall of each column in the x-direction is at least partially shielded (depending on a size of the opening in the photoresist 1015 in the y-direction) by the shielding material 1017 (referring to FIG. 4 (A)). After that, the photoresist 1015 may be removed.

Figure 4B:
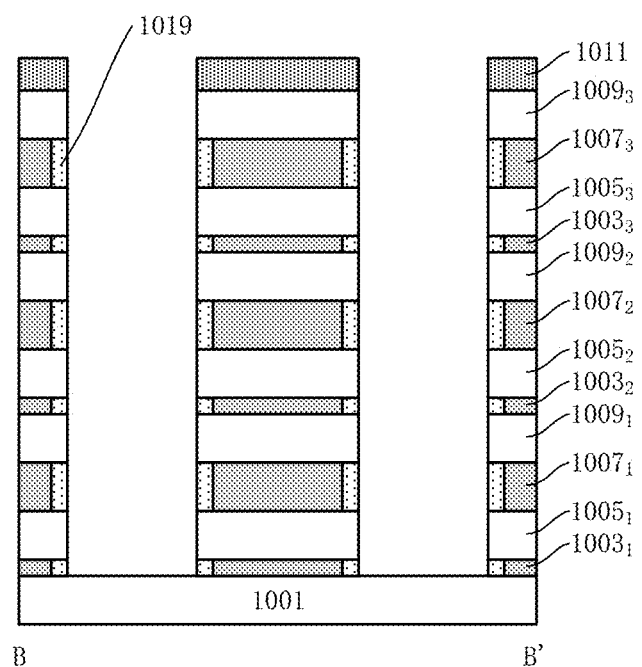

In order to form a self-aligned gate stack, a gap for forming the gate stack (which may be referred to as a "gate gap") may be defined based on the channel defining layer. For example, as shown in FIG. 4(A) and FIG. 4(B), the exposed sidewalls of the channel defining layers $1007_1$, $1007_2$ and $1007_3$ may be selectively etched to be relatively recessed (with respect to the upper and lower source/drain layers). In order to achieve a good etching control, Atomic Layer Etching (ALE) may be used here. Thus, for each device layer L1, L2, L3, a gap (i.e., the gate gap) is defined between the upper and lower source/drain layers. The gap is originally occupied by the channel defining layer, and thus may be self-aligned to the channel defining layer. The gate gaps on two opposite sides of the channel defining layer in the y-direction may have substantially the same dimension (heights in the vertical direction may correspond to the thickness of the channel defining layer, and widths in the y-direction may be substantially equal to each other).

An etching degree of an etching recipe on the channel defining layers $1007_1$, $1007_2$ and $1007_3$ may be substantially the same, so that the sidewalls of the channel defining layers $1007_1$, $1007_2$ and $1007_3$ after etching may be substantially aligned or substantially coplanar in the vertical direction. In addition, the sacrificial layers $1003_1$, $1003_2$ and $1003_3$ containing SiGe (same as the channel defining layer) may also be etched to be relatively recessed, and therefore may form corresponding gaps (which may be referred to as "isolation gaps").

In the formed gate gap, in order to prevent a subsequent processing from remaining a material in the gate gap so as to affect a formation of the gate stack, a first position retaining layer 1019 (which may also be referred to as a "sacrificial gate") may be filled in the gate gap. For example, the first position retaining layer 1019 such as an oxide may be filled in the gate gap by deposition and then etching back (such as RIE). Similarly, the isolation gap may also be filled with the first position retaining layer 1019.

Figure 5A:
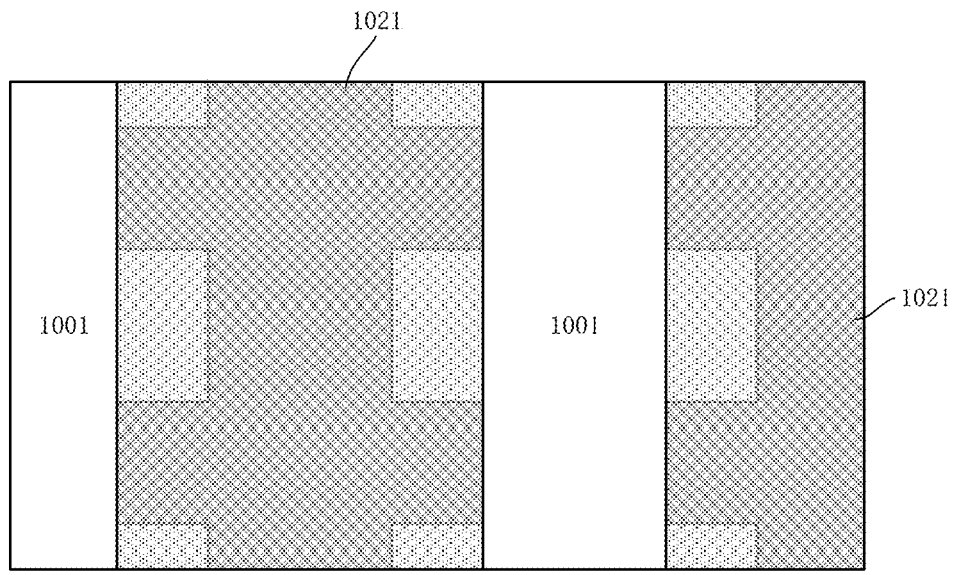
Figure 5B:
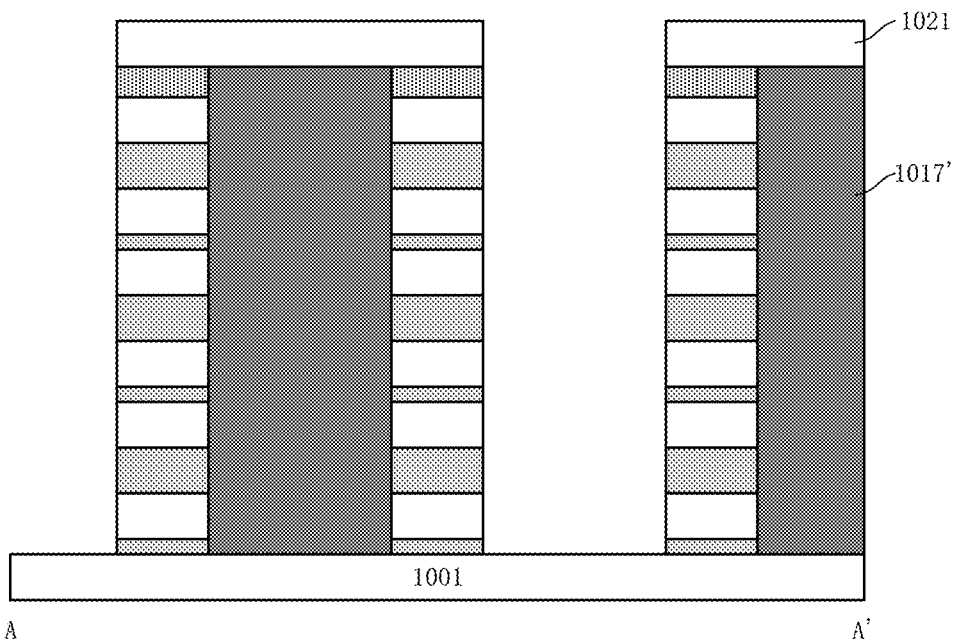
Figure 5C:
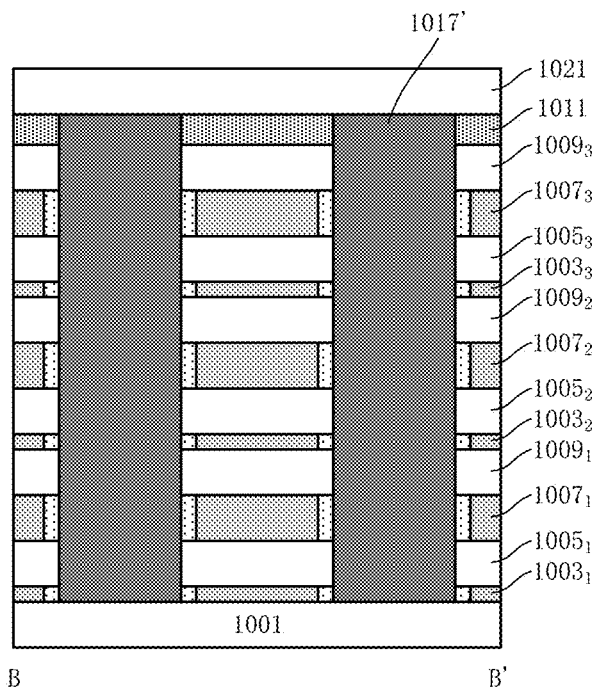

Then, two opposite sides of the active region in the x-direction may be processed. Similarly, a shielding material may be formed firstly, and then may be patterned to expose the two sides to be processed. For example, as shown in FIG. 5(A), FIG. 5(B) and FIG. 5(C), the shielding material may be formed on the substrate 1001 by a process such as deposition and then planarization. For ease of a subsequent etching process, the shielding material formed here may contain the same material, such as SiC, as the previous shielding material 1017, and thus may be shown as 1017' integrally with the previous shielding material 1017. Then, the shielding material 1017' may surround each column.

When exposing the two opposite sides in the x-direction, the sides may be separately processed taking into account a supporting function required in a substitution of the isolation layer.

For example, a photoresist 1021 may be formed and may be patterned to expose one side of each column in the x-direction. For example, the photoresist 1021 may include an opening extending in the y-direction between each pair of adjacent columns. The patterned photoresist 1021 may be used as an etching mask to etch the shielding material 1017' by selective etching such as RIE. The RIE may be performed in the substantially vertical direction and may stop on the surface of the substrate 1001. Then, one sidewall of each column in the x-direction may be exposed, while the other sidewall in the x-direction and at least part of the sidewalls (depending on a size of the opening in the photoresist 1021 in the x-direction) in the y-direction may be shielded by the shielding material 1017'. After that, the photoresist 1021 may be removed.

Figure 6:
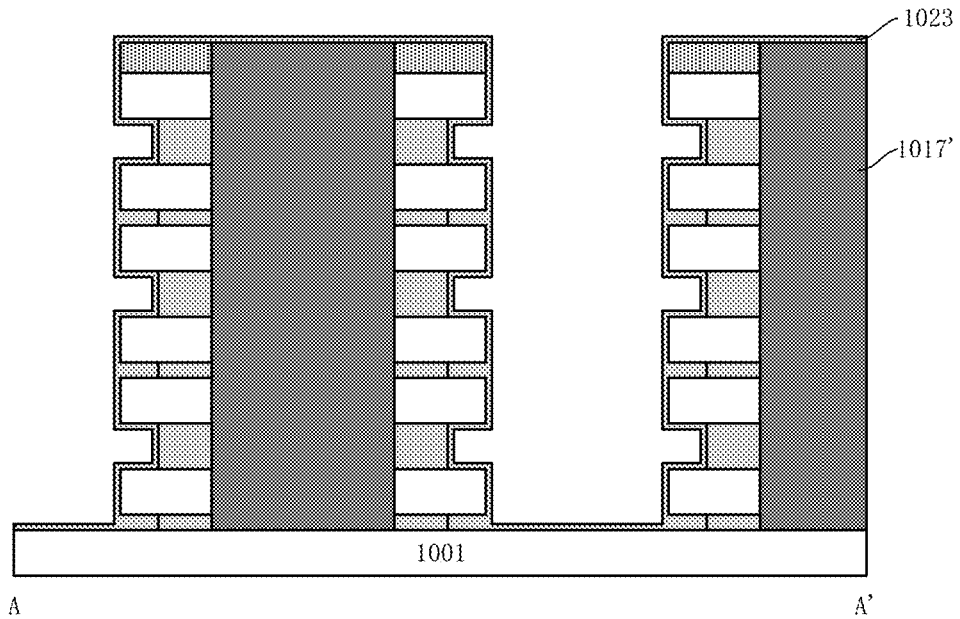

Processing similar to that in FIG. 4(A) and FIG. 4(B) may be performed on the currently exposed sidewall of each column, so as to define the gate gap. For example, as shown in FIG. 6, the exposed sidewalls of the channel defining layers $1007_1$, $1007_2$ and $1007_3$ may be selectively etched to be relatively recessed (with respect to the upper and lower source/drain layers). Similarly, ALE may be used. Then, the gate gaps self-aligned to the channel defining layers may be formed. After that, the position retaining layers may be formed to fill the gate gaps.

Here, similarly, the sacrificial layers $1003_1$, $1003_2$ and $1003_3$ may also be relatively recessed, so as to form the isolation gaps. In the processing described above in combination with FIG. 4(A) and FIG. 4(B), the position retaining layer may be further filled in the isolation gaps, which may affect a subsequent replacement of the sacrificial layers. In order to prevent the position retaining layer from filling the isolation gaps, the isolation gaps may be fully filled firstly.

For example, a filling layer 1023 may be formed by epitaxial growth. A growth thickness of the filling layer 1023 may be greater than half of a thickness of each sacrificial layer $1003_1$, $1003_2$, $1003_3$, so that each isolation gap may be fully filled. In addition, the filling layer 1023 may not fully fill the gate gaps (in which the position retaining layer or the sacrificial gate may be formed). To this end, on one hand, the thickness of the channel defining layer may be greater than the thickness of the sacrificial layer (the growth thickness of the filling layer 1023 may be less than half of the thickness of the channel defining layer) as described above. On the other hand, an etching depth of the channel defining layer when forming the gate gap is preferably greater than half of the thickness of the sacrificial layer (the growth thickness of the filling layer 1023 may be less than the etching depth of the channel defining layer). Then, as shown in FIG. 6, the filling layer 1023 may fully fill each isolation gap without fully filling each gate gap.

A material of the filling layer 1023 may have similar or substantially the same etching selectivity as the material of the sacrificial layer, so as to be subsequently removed together by the same etching recipe. For example, the filling layer 1023 may contain SiGe, with an atomic percentage of Ge of, for example, about 10% to 40%.

Figure 7:
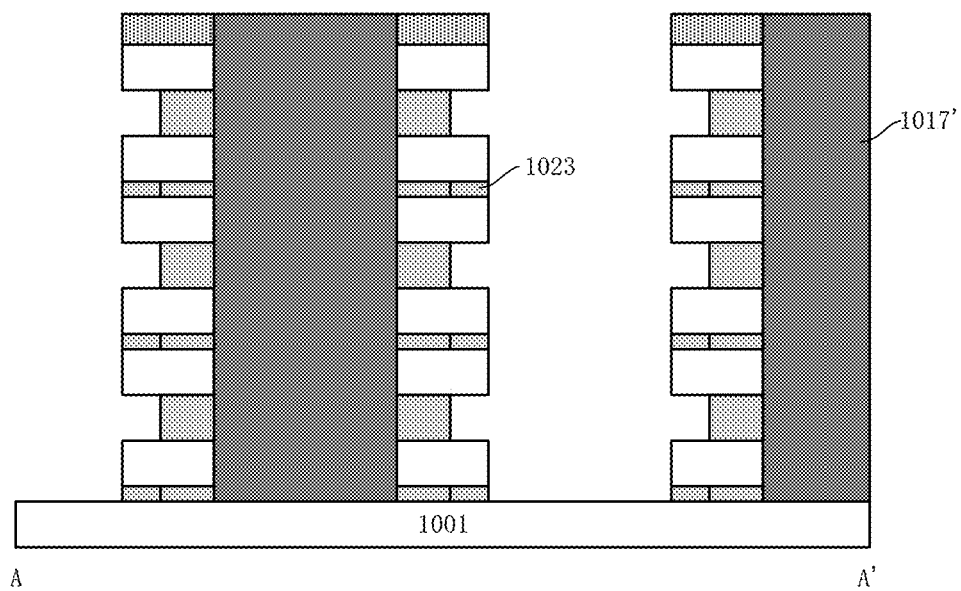

After that, as shown in FIG. 7, a certain thickness of the filling layer 1023 may be removed by selective etching. For example, a removal thickness may be substantially equal to or slightly greater than a growth thickness of the filling layer 1023. Then, the filling layer 1023 may be removed from the gate gaps and left in the isolation gaps. In order to control the removal thickness well, ALE may be used.

Figure 8:
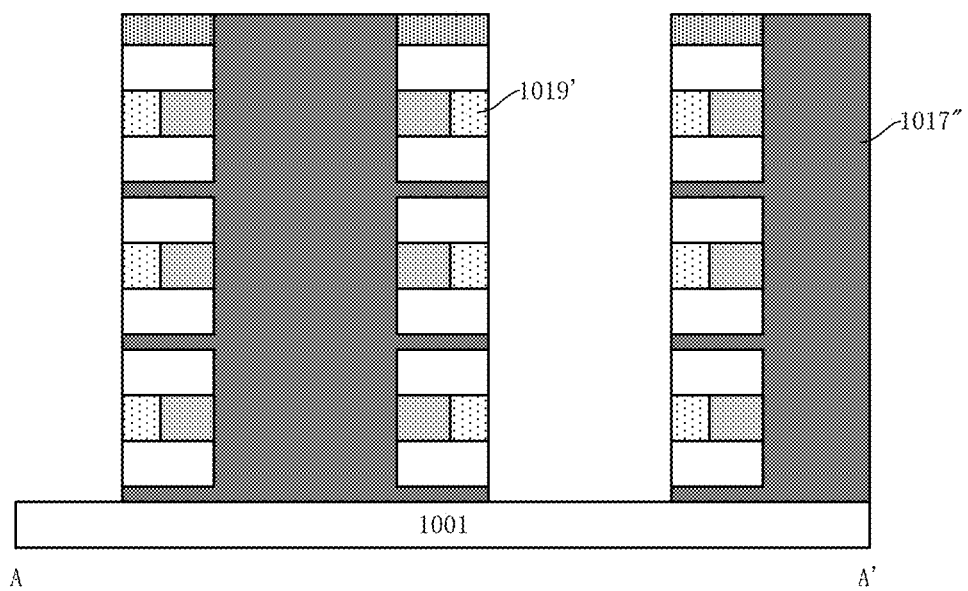

Then, as shown in FIG. 8, a second position retaining layer 1019' may be formed as described above. A material of the second position retaining layer 1019' may have similar or substantially the same etching selectivity as the material of the first position retaining layer 1019, so as to be subsequently removed together by the same etching recipe. For example, the second position retaining layer 1019' may contain an oxide.

In the embodiments described above, the first position retaining layer 1019 and the second position retaining layer 1019' are formed in different steps, which may help control the length of the subsequently grown channel layer in the y-direction and the topography of the end portion in the y-direction. However, the present disclosure is not limited to this. The first position retaining layer 1019 and the second position retaining layer 1019' may also be formed in the same step, particularly in a case of forming the channel layer by using the channel defining layer itself. For example, the two opposite sides of each channel defining layer in the y-direction and one side of the channel defining layer in the x-direction (the other side in the x-direction may be shielded by the shielding material) may be selectively etched to be relatively recessed, and the position retaining layer may be formed in the gaps obtained in this way.

Currently, each channel defining layer is surrounded by the shielding material, the position retaining layer and the source/drain layer, and a sidewall of the filling layer 1023 is exposed. The filling layer 1023 and the sacrificial layer exposed by a removal of the filling layer 1023 may be removed by selective etching. The etching may stop on the shielding material 1017'. In this way, the sacrificial layers between the device layers may be removed (while each device layer is still retained by the shielding material 1017'). In a gap left by the removal of the sacrificial layer, a dielectric material may be filled to form an isolation layer by a process such as deposition (e.g., Chemical Vapor Deposition (CVD), Atomic Layer Deposition (ALD), etc.) and then etching back (e.g., RIE). A suitable dielectric material, such as oxide, nitride, SiC or a combination thereof, may be selected for various purposes, such as optimizing isolation reliability, leakage current or capacitance, etc. Thus, each device layer may be isolated from each other. Here, for ease of description only, the filled dielectric material may contain SiC, and thus may be shown as 1017" integrally with the shielding material 1017'.

Next, the channel layer may be formed.

Figure 9:
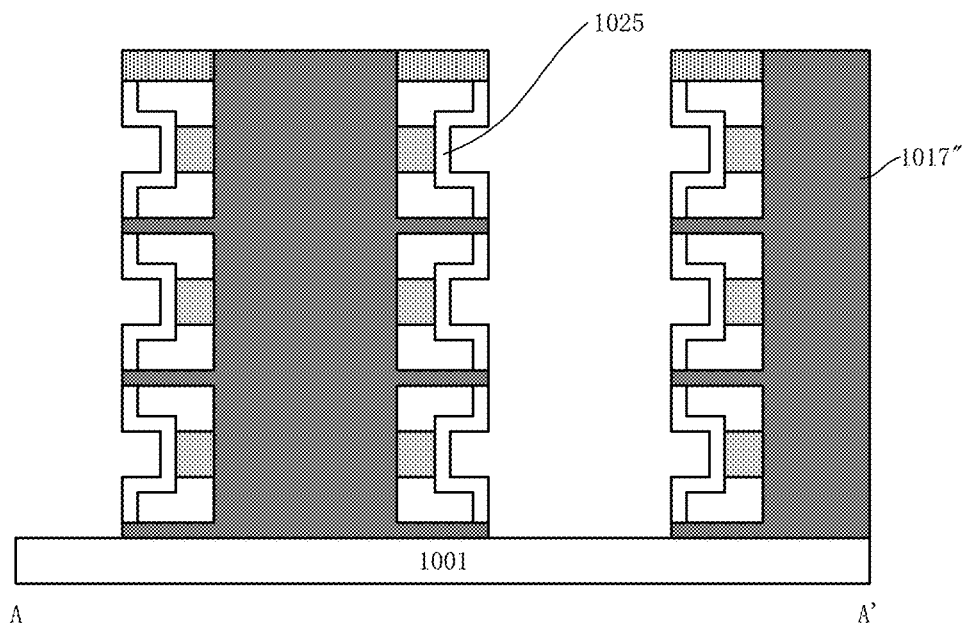

For example, as shown in FIG. 9, the position retaining layer 1019' may be removed by selective etching. Here, the position retaining layer 1019 may be retained because it is covered by the shielding material 1017". Thus, the gate gap occupied by the position retaining layer 1019' may be released. In the released gate gap, a semiconductor layer may be formed by selective epitaxial growth. The semiconductor layer may be grown along a surface of the channel defining layer and a surface of the source/drain layer. Hereinafter, for ease of illustration and description only, a part of the semiconductor layer located on the sidewall of the channel defining layer is separately shown and referred to as a channel layer 1025 (in which a channel portion may be mainly formed), and a part of the semiconductor layer located on the surface of the source/drain layer may be integrally shown with the source/drain layer and referred to as a source/drain layer (in which a source/drain region may be formed) (referring to a dotted line in FIG. 10). The channel layer 1025 may be formed on a sidewall of the channel defining layer in the x-direction (the sidewall originally covered by the position retaining layer 1019'). The channel layers 1025 in each device layer may be substantially aligned or substantially coplanar in the vertical direction.

In the embodiment, in order to make the two sides of the channel layer 1025 have substantially the same gate length, the channel defining layer and the source/drain layer may be etched back a certain thickness before a growth of the semiconductor layer. A growth thickness of the semiconductor layer may be selected to be substantially equal to an etch-back thickness of the source/drain layer, so that a height of the gate gap after the growth of the semiconductor layer may be substantially the same as the thickness of the channel defining layer. A material of the channel layer 1025 may be selected to achieve a desired device performance. For example, the channel layer 1025 may contain the same material as the source/drain layer, such as Si, or may contain a different material from the source/drain layer, such as SiGe.

In this embodiment, the channel layer 1025 may be grown additionally. This helps control the thickness of the channel layer 1025, and subsequent selective etching may be easily controlled. Therefore, a dual precise control of the thickness and the gate length of the channel layer may be achieved without the help of photolithography and selective ALE. However, the present disclosure is not limited to this. For example, the channel portion may be formed directly by using the channel defining layer.

Next, the other side of each column in the x-direction may be processed.

Figure 10:
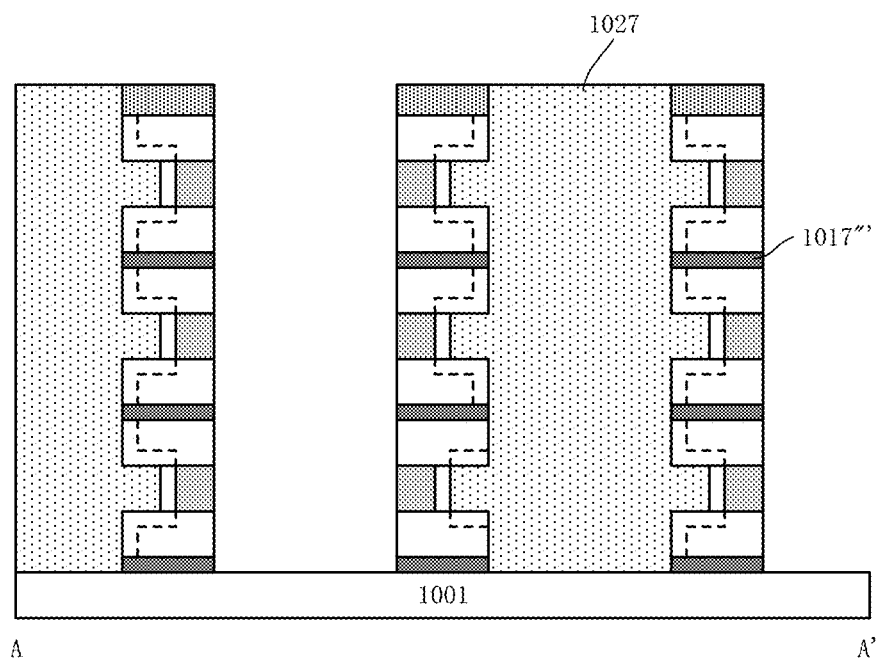

For example, as shown in FIG. 10, another shielding material 1027 may be formed on the substrate 1001 by a process such as deposition and then planarization. The another shielding material 1027 may fill a gap between the shielding materials 1017" on the substrate 1001. In order to remove the shielding material 1017" to expose the side to be processed, the another shielding material 1027 may contain a material having etching selectivity relative to the shielding material 1017", such as an oxide. After that, a selective etching such as RIE may be performed on the shielding material 1017". The RIE may be performed in the substantially vertical direction, and may stop on the substrate 1001. Therefore, a part of the shielding material 1017" under the hard mask layer may be left (forming an isolation layer and shown as 1017"), and other parts of the shielding material 1017" may be removed. In this way, the other side of the channel defining layer in the x-direction may be exposed (although the shielding material 1017" on the other two sides in the y-direction is also removed, the two opposite sides of the channel layer 1025 in the y-direction may be shielded due to the existence of the position retaining layer 1019).

Figure 11:
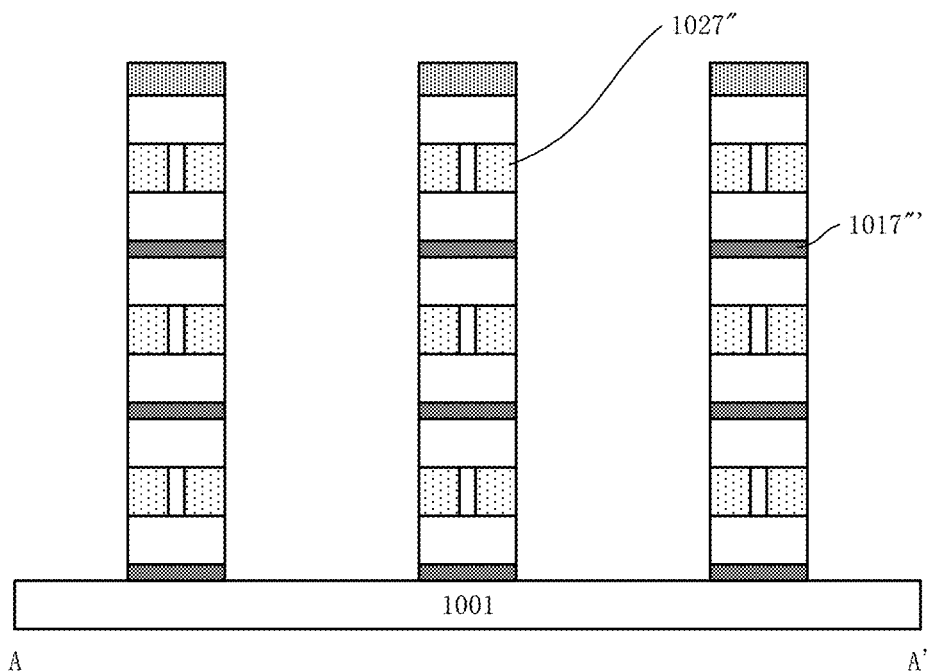

The gate gap may also be defined on the side currently exposed in the x-direction. For example, as shown in FIG. 11, an selective etching may be performed on the channel defining layers $1007_1$, $1007_2$ and $1007_3$. Similarly, ALE may be used. Here, the etching of the channel defining layer may stop on the channel layer 1025, so that the channel layer 1025 may be left between the upper and lower source/drain layers. Then, the gate gaps may be formed. The gate gaps on two opposite sides of the channel layer 1025 in the x-direction may have substantially the same dimension (heights in the vertical direction may correspond to the thickness of the channel defining layer, and widths in the x-direction may be substantially equal to each other).

In a case that the channel layer 1025 is not grown additionally and the channel portion is formed by using the channel defining layers $1007_1$, $1007_2$ and $1007_3$, the gate gaps may be similarly formed around the channel defining layers $1007_1$, $1007_2$ and $1007_3$. For example, the channel defining layers $1007_1$, $1007_2$ and $1007_3$ may leave a residual portion similar to the channel layer 1025 by selective etching such as ALE.

In the gate gap formed in this way, a third position retaining layer 1027" may be similarly formed. For example, the third position retaining layer 1027" may be formed by depositing and then etching back (e.g., ME) an oxide. The ME may be performed in the substantially vertical direction and may stop on the surface of the substrate 1001.

As shown in FIG. 11, a plurality of columns arranged in an array (for example, in the form shown in FIG. 2(A) or FIG. 2(B)) are formed on the substrate 1001. A plurality of device layers are stacked in each column, and each device layer may include a first source/drain layer, a second source/drain layer and a channel layer between the first source/drain layer and the second source/drain layer. The gate gap may be formed around the channel layer, and the gate gap may be occupied by the position retaining layer. The gate gap is self-aligned to the channel layer. Each device layer is isolated from each other by the isolation layer.

Currently, the sidewall of each source/drain layer is exposed to the outside. A source/drain region may be formed by doping the source/drain layer through the exposed sidewalls.

Figure 12:
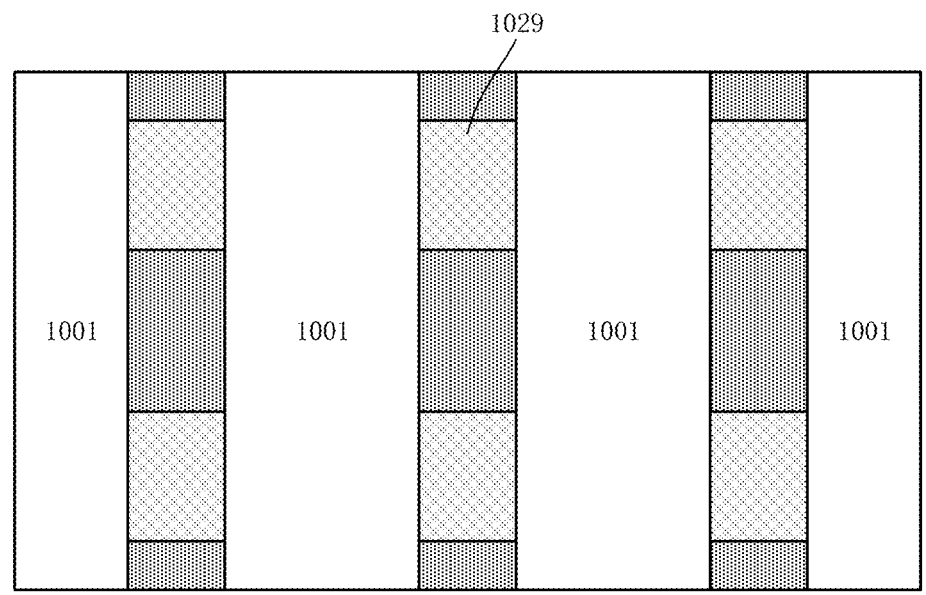

In the embodiment shown in FIG. 11, the hard mask layer 1011 may be used as a mask during the etching-back process of forming the third position retaining layer 1027". Then, the opposite sidewalls of each source/drain layer in each direction of the x-direction and the y-direction are exposed to the outside, so that doping may be performed through each sidewall. According to another embodiment of the present disclosure, as shown in FIG. 12, during the etching-back process of forming the third position retaining layer 1027", a photoresist 1029 may be additionally formed, and the photoresist 1029 may be patterned to shield the opposite sidewalls of each column in the y-direction. Therefore, in addition to occupying the gate gap, the formed third position retaining layer 1027" may further shield the opposite sidewalls of each column in the y-direction. In this way, doping may be performed through the sidewalls of each source/drain layer in the x-direction, so that a change in doping characteristics caused by a difference in respective widths of the gate gaps on the opposite sides in the x-direction and the gate gaps on the opposite sides in the y-direction may be suppressed.

Figure 13:
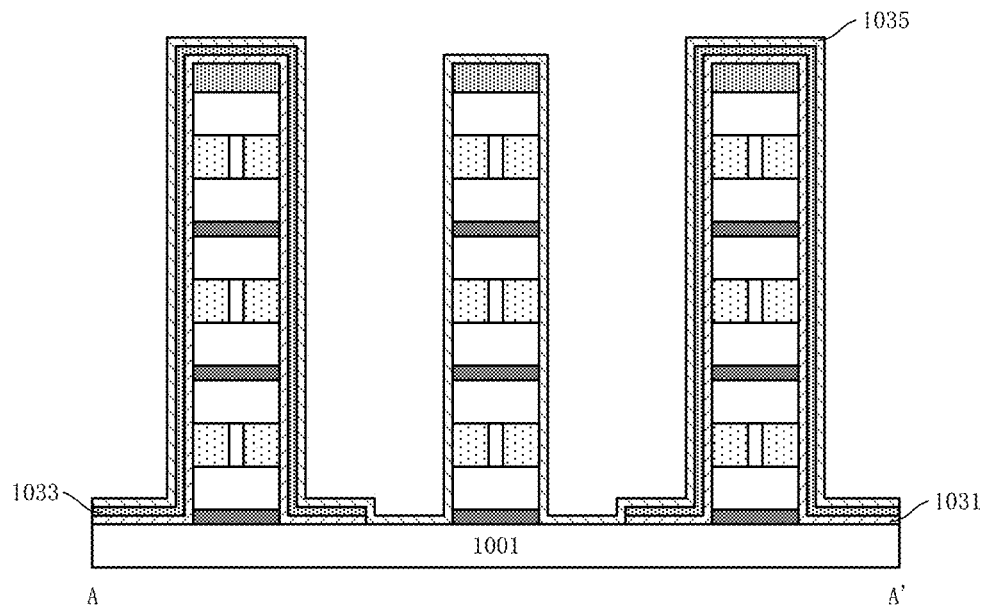

In order to perform the doping, as shown in FIG. 13, a dopant source layer may be formed on the surface of each column by, for example, deposition. The dopant source layer may be formed in a substantially conformal manner. Here, a formation of two types (n-type and p-type) of devices is illustrated by way of example for description, and therefore n-type doping and p-type doping are required. For example, an n-type dopant source layer 1031 may be formed firstly, and may be patterned to cover a column in which an n-type device is to be formed. Then, a p-type dopant source layer 1035 may be formed. In order to avoid an interdiffusion between the n-type dopant source layer 1031 and the p-type dopant source layer 1035, a diffusion barrier layer 1033 may be formed therebetween. For example, the diffusion barrier layer 1033 may be formed on the n-type dopant source layer 1031 and may be patterned together with the n-type dopant source layer 1031. The n-type dopant source layer 1031 may contain an n-type dopant, such as a P- or As-doped oxide, a concentration of the dopant may be about 0.1% to 10%, and a thickness thereof may be about 1 nm to 10 nm. Similarly, the p-type dopant source layer 1035 may contain a p-type dopant, such as a B-doped oxide, a concentration of the dopant may be about 0.1% to 10%, and a thickness thereof may be about 1 nm to 10 nm. The diffusion barrier layer 1033 may contain a nitride with a thickness of about 2 nm to 10 nm.

Figure 14:
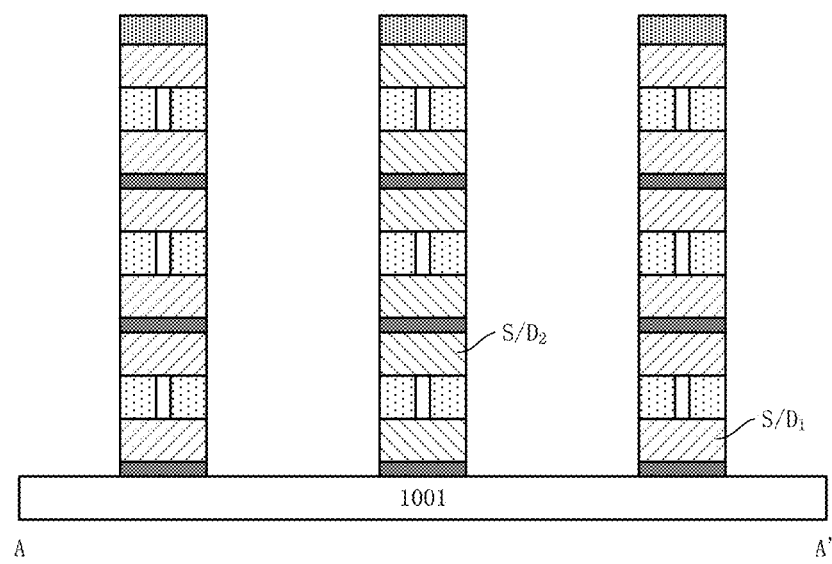

Then, as shown in FIG. 14, the dopant may be driven into the source/drain layer from the dopant source layer by, for example, an annealing process, so as to form the source/drain region in the source/drain layer. Here, an n-type source/drain region $S/D_1$ and a p-type source/drain region $S/D_2$ are shown. The substrate 1001 may also be doped. The position retaining layer may prevent the dopant from directly entering the channel layer 1025. Certainly, a small amount of dopant entering through the source/drain layer may exist at an end portion of the channel layer 1025 close to the source/drain layer. After that, the n-type dopant source layer 1031, the p-type dopant source layer 1035 and the diffusion barrier layer 1033 may be removed.

In this example, the source/drain layers in each column are doped to a same conductivity type. However, the present disclosure is not limited to this. For example, the source/ drain layers in different device layers in each column may be doped to different conductivity types through an appropriate design of the dopant source layer.

In the embodiment, a surface of the source/drain layer may be silicided to reduce a contact resistance. For example, a metal such as NiPt may be formed on the surface of each column and an annealing may be performed, so that the metal may react with Si in the source/drain layer, to form a metal silicide such as NiPtSi. After that, the metal that is unreacted may be removed.

Figure 15:
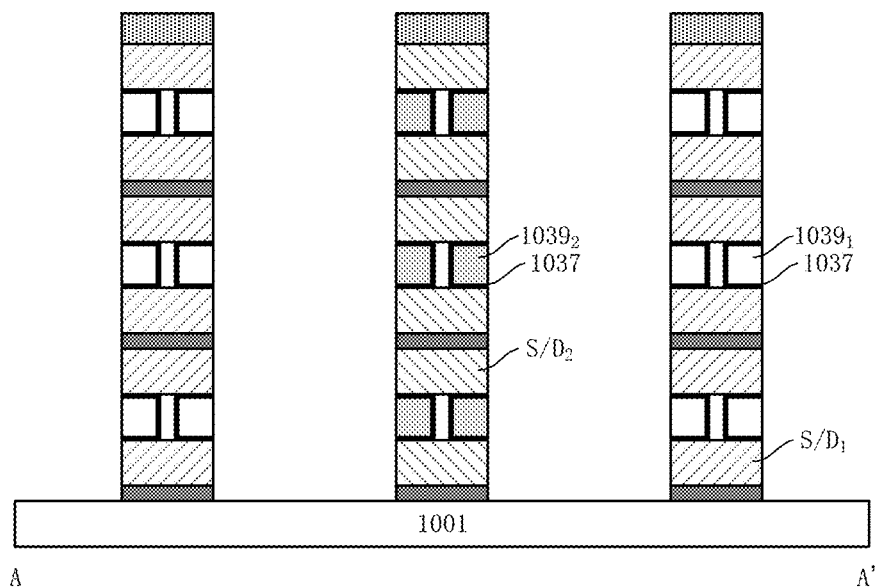

Next, a replacement gate process may be performed to replace the position retaining layer with a gate stack. For example, as shown in FIG. 15, the position retaining layers 1019 and 1027" may be removed by selective etching, so as to release the gate gaps. A gate dielectric layer 1037 may be formed in a substantially conformal manner by, for example, deposition such as ALD. On the gate dielectric layer 1037, a gate conductor layer may be formed, by for example, deposition such as ALD. Here, firstly forming a gate conductor layer $1039_1$ of an n-type device is illustrated by way of example. The deposited gate conductor layer $1039_1$ may fully fill the gate gap. A part of the gate conductor layer $1039_1$ outside the gate gap may be removed by etching back such as RIE, so that the gate conductor layer $1039_1$ may be left in the gate gap. Then, the n-type device may be covered and the p-type device may be exposed by, for example, using a photoresist. The gate conductor layer $1039_1$ formed in the gate gap of the p-type device may be removed by selective etching, so as to release the gate gaps thereof. A gate conductor layer $1039_2$ of a p-type device may be similarly formed in the gate gap of the p-type device. The gate dielectric layer 1037 may include a high-k gate dielectric such as $HfO_2$, and the gate conductor layers $1039_1$ and $1039_2$ may include a metal gate conductor with a corresponding work function. Here, the n-type device and the p-type device may have the same gate dielectric layer 1037. However, the present disclosure is not limited to this. For example, they may have different gate dielectric layers. In addition, a sequence of forming the gate conductor layer may be reversed.

In this way, a vertical device is formed in each device layer of each column. Each vertical device may include the channel layer 1025, and the first and second source/drain layers on the upper and lower sides of the channel layer 1025. The gate stack (a stack of the gate dielectric layer and the gate conductor layer) may surround the channel layer 1025 and may be self-aligned to the channel layer 1025. Each column may be referred to as a device stack. The substrate 1001 may be relatively recessed as a groove between the device stacks.

Currently, sidewalls of components require to be electrically connected in each device, such as the gate conductor layer (which may also be referred to as the gate electrode) and the source/drain region (or a silicide formed on the surface thereof), are exposed to the outside. Then, an interconnection structure laterally adjacent to each device may be formed to interconnect the devices in each device stack. Here, since the interconnection structure is laterally adjacent to the device and is in contact with the sidewall of the component require to be electrically connected in the device, it may be referred to as a sidewall interconnection structure.

In addition, in order to avoid undesired electrical short circuits when forming the interconnection structure, conductive structures at different heights may be connected to the devices on different sides. For example, a first component require to be electrically connected at a height in the device may be connected to a conductive structure in the interconnection structure on a first side, and a second component require to be electrically connected that is adjacent to the first component in the vertical direction may be connected to a conductive structure in the interconnection structure on a second side different from the first side (e.g., opposite to the first side). In addition, a sidewall of the first component on the second side may be covered by an isolation layer, and a sidewall of the second component on the first side may be covered by an isolation layer, so as to avoid short circuits.

The embodiments of forming the isolation layer will be described below.

Figure 16A:
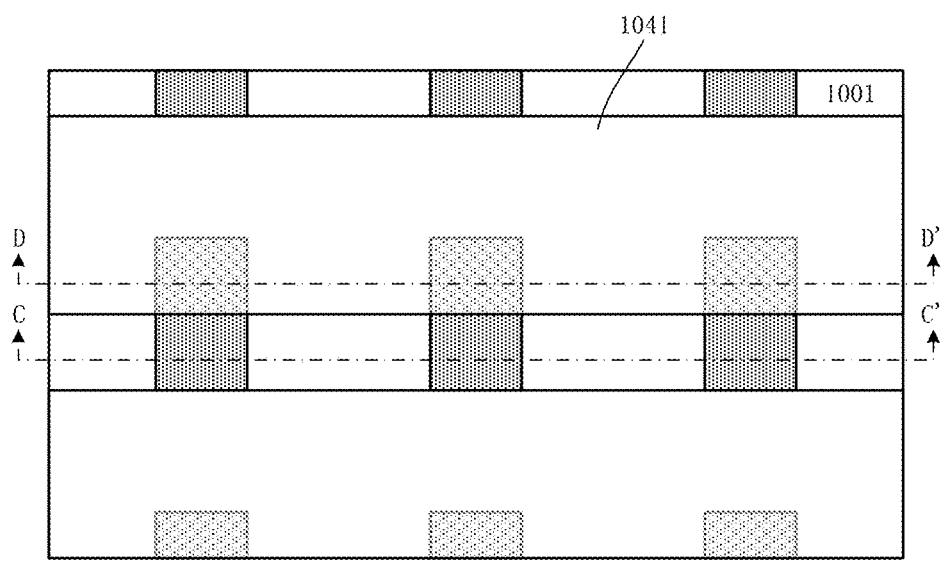
Figure 16B:
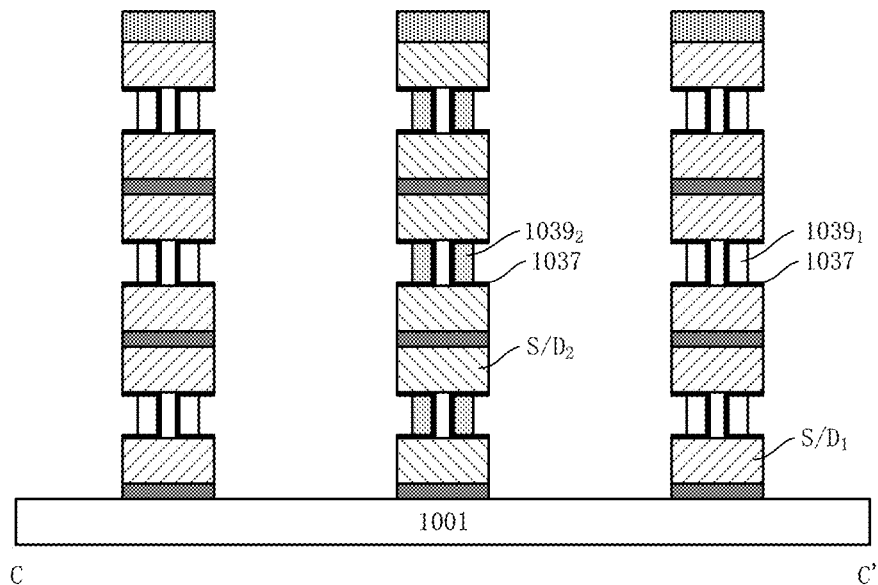
Figure 16C:
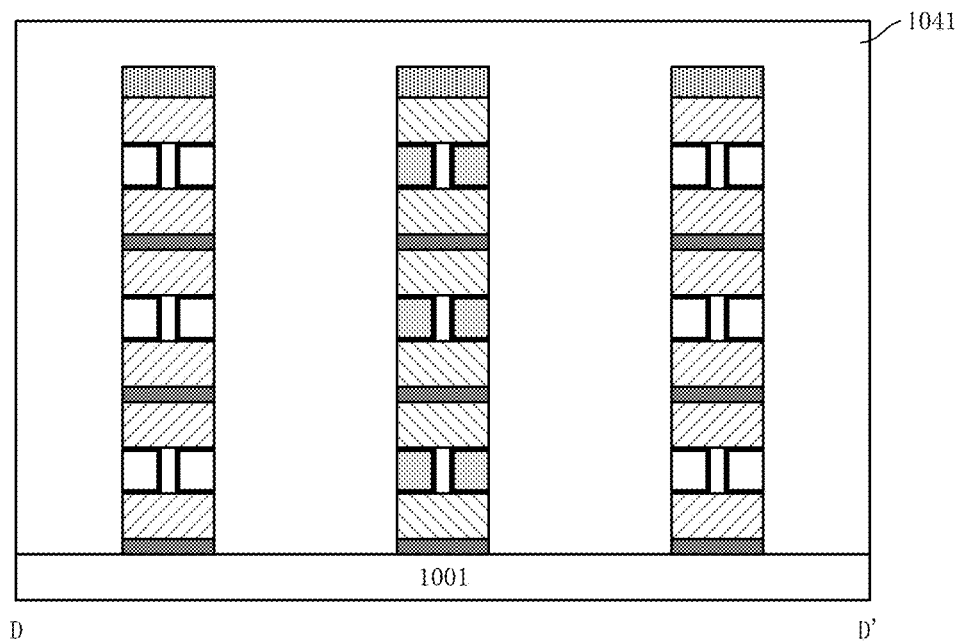

For example, as shown in FIG. 16(A), FIG. 16(B) and FIG. 16(C), a photoresist 1041 may be formed on the substrate 1001, and may be patterned to shield one side of each device stack (an upper side in the y-direction in FIG. 16(A)) and expose the other side of each device stack (a lower side in the y-direction in FIG. 16(A)). On the exposed side of each device stack, by selective etching, the gate conductor layer may be recessed relatively to a depth of, for example, about 5 nm to 20 nm, so as to release some gate gaps. A self-aligned isolation layer may be subsequently formed in the gate gaps. After that, the photoresist 1041 may be removed.

Figure 17A:
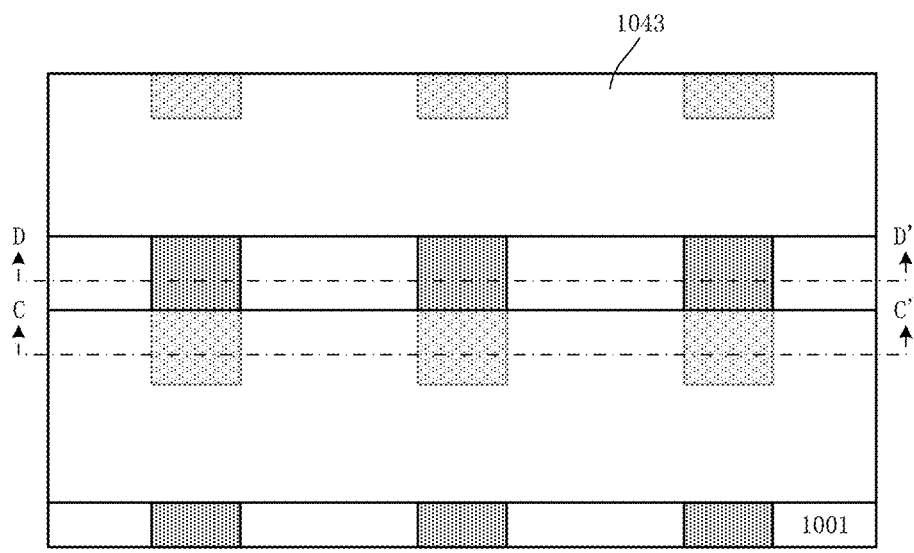
Figure 17B:
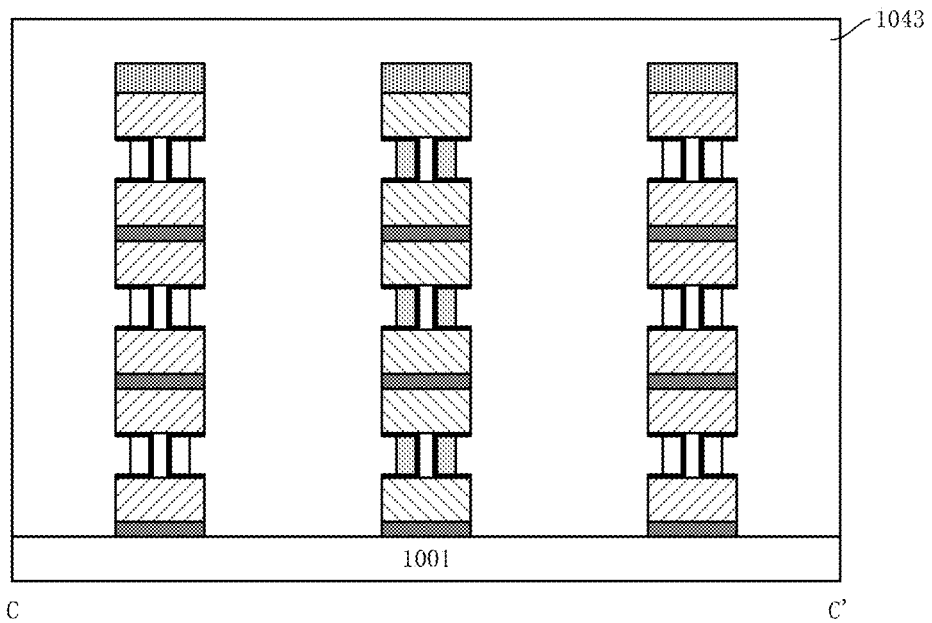
Figure 17C:
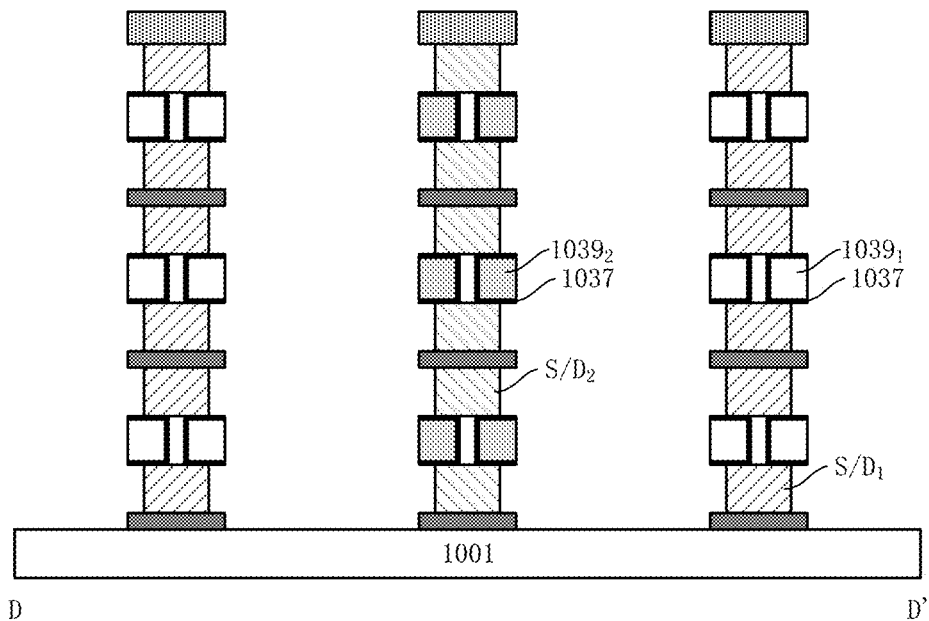

Then, as shown in FIG. 17(A), FIG. 17(B) and FIG. 17(C), a photoresist 1043 may be formed on the substrate 1001, and may be patterned to shield one side of each device stack (a lower side in the y-direction in FIG. 17(A)) and expose the other side of each device stack (an upper side in the y-direction in FIG. 17(A)). On the exposed side of each device stack, by selective etching, the source/drain layer may be recessed relatively to a depth of, for example, about 5 nm to 20 nm (which may be the same as the depth of the previously released gate gap, so that the subsequently filled isolation layer may have approximately the same thickness), so as to release some gate gaps. A self-aligned isolation layer may be subsequently formed in the gate gaps. After that, the photoresist 1043 may be removed.

Figure 18A:
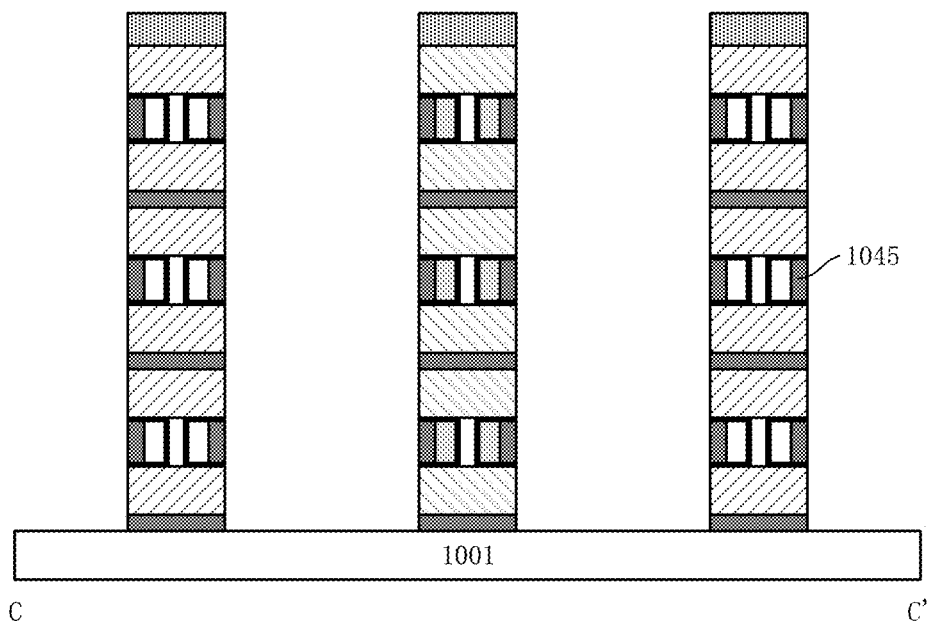
Figure 18B:
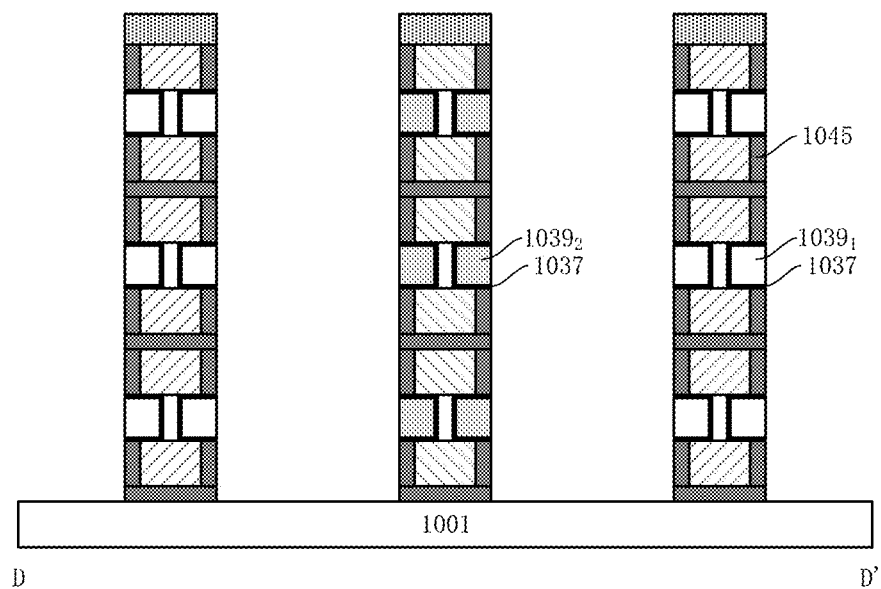

Therefore, in each device stack, the source/drain layer may protrude relatively on one side, and the gate conductor layer may protrude relatively on the other side. The isolation layer may be formed in respective opposite recesses. For example, as shown in FIG. 18(A) and FIG. 18(B), an isolation layer 1045 may be filled in the recesses by a process of deposition and then etching back. Taking into account etching selectivity with respect to a subsequently formed interlayer dielectric layer, the isolation layer 1045 may contain a dielectric material such as SiC. The isolation layers 1045 in different device layers may be substantially aligned or substantially coplanar in the vertical direction.

Next, the interconnection structure may be manufactured. When manufacturing an interconnection line in the interconnection structure, in order to avoid a difficulty in etching a groove and then filling the groove with a conductive material such as a metal in a conventional process, a conductive structure may be formed firstly and then a dielectric material is filled according to the embodiments of the present disclosure.

For the current device stack, a lowermost layer is the first source/drain layer or the source/drain region of the device layer L1. A conductive structure for the first source/drain layer may be formed firstly.

Taking into account an electrical isolation from the substrate 1001 and a matching in height with the first source/drain layer, an electrical isolation layer with a certain thickness may be firstly formed in the groove between each device stack, so that a conductive structure subsequently formed on the electrical isolation layer may be located at a height corresponding to the first source/drain layer and thus may be laterally adjacent to the first source/drain layer. In addition, it is desired that the formed electrical isolation layer may expose the sidewall of each device stack, so as to avoid affecting an electrical contact with the sidewall interconnection structure.

Figure 19:
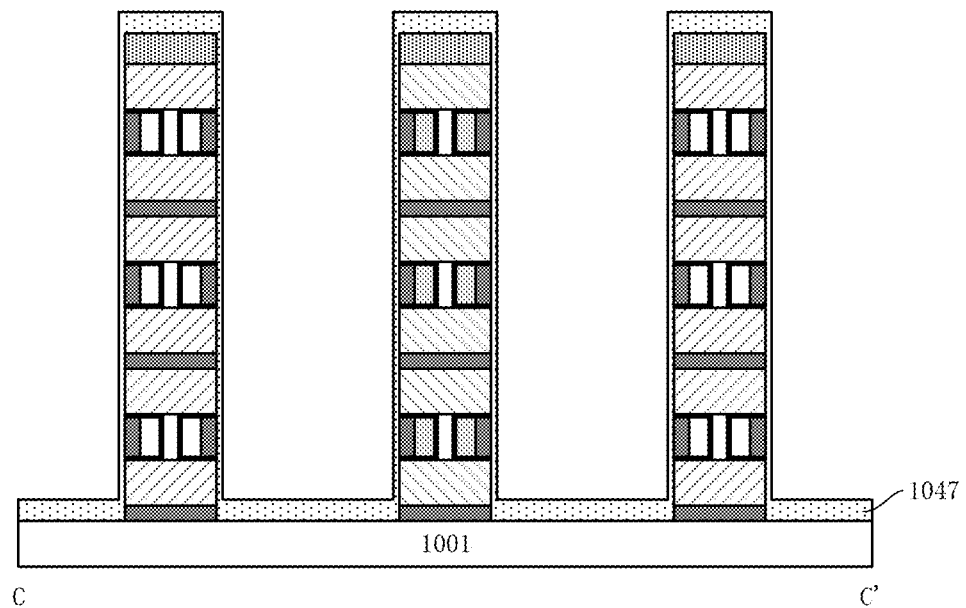

The electrical isolation layer may be formed, for example, in the following manner. As shown in FIG. 19, a preliminary isolation layer 1047 may be formed by depositing a dielectric material such as an oxide. In order to form the electrical isolation layer as described above, the preliminary isolation layer 1047 may be formed to include a thicker laterally extended portion and a thinner vertically extended portion. This may be achieved by, for example, a High Density Plasma (HDP) deposition. Here, the thicker portion of the preliminary isolation layer 1047 may have a thickness of about 20 nm to 150 nm.

Figure 20A:
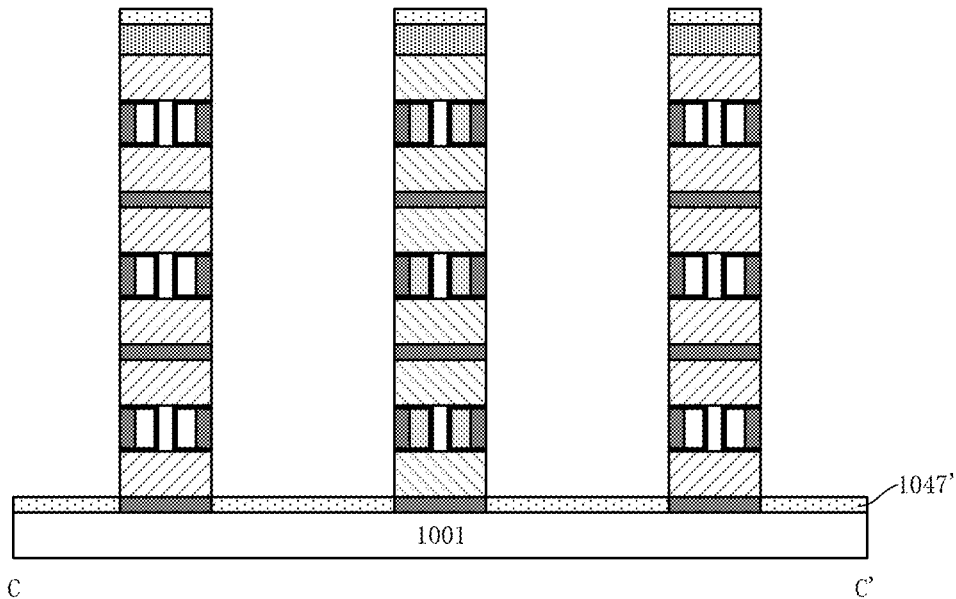
Figure 20B:
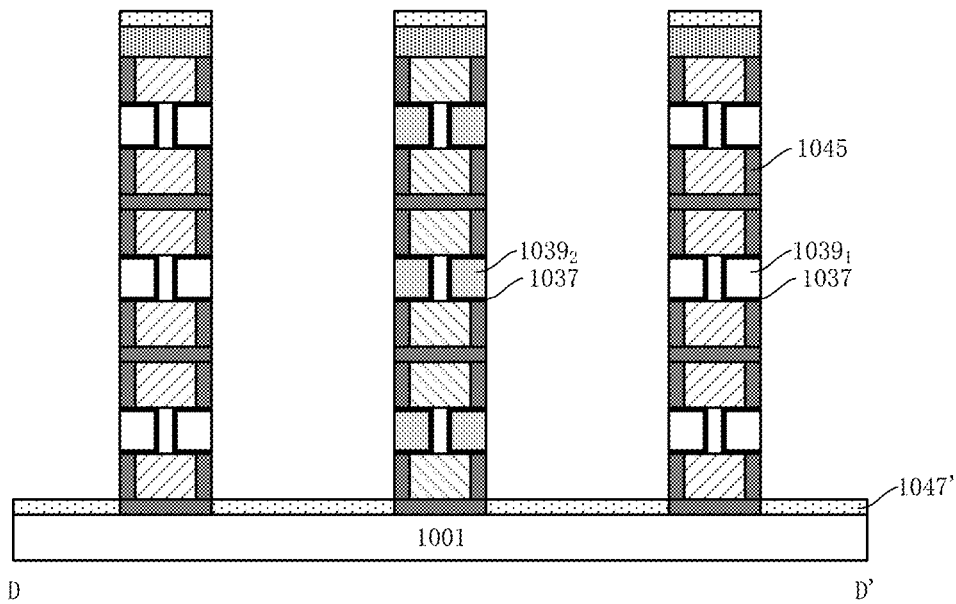

Then, as shown in FIG. 20(A) and FIG. 20(B), the preliminary isolation layer 1047 may be isotropically etched, so that the vertically extended portion of the preliminary isolation layer 1047 may be removed and the laterally extending portion of the preliminary isolation layer 1047 may be remained. For example, a remaining portion may have a thickness of about 15 nm to 100 nm. Then, the preliminary isolation layer 1047 may be left in the groove between each isolation device (a portion may be left on a top of the device stack, but this may not affect a subsequent process), so as to form the electrical isolation layer 1047'.

Next, a conductive structure may be manufactured on the electrical isolation layer 1047'.

Figure 21:
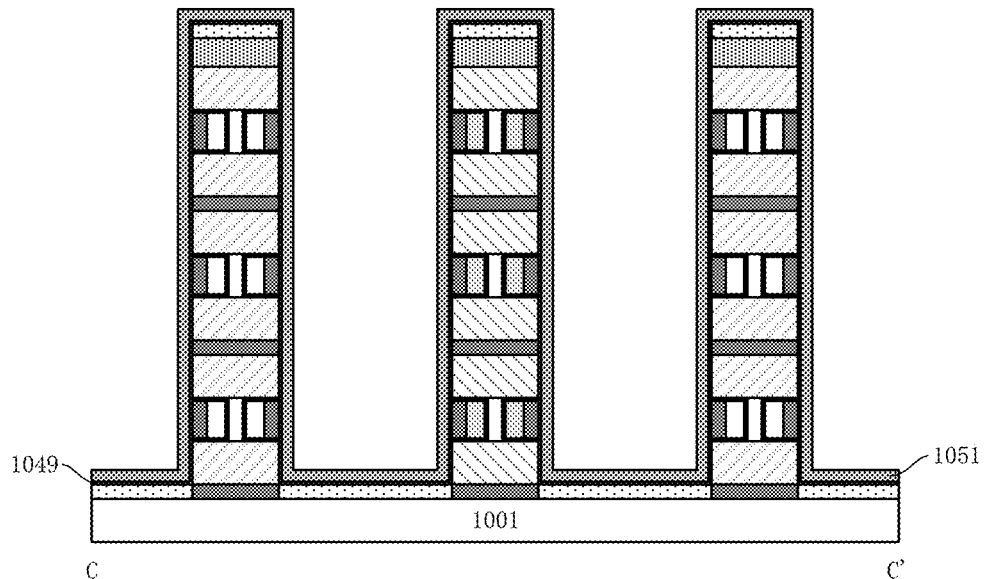

For example, as shown in FIG. 21, a conductive barrier layer 1049 and a conductive body layer 1051 may be sequentially formed in a substantially conformal manner by deposition. The conductive barrier layer 1049 may prevent a diffusion of the conductive body layer 1051 to the surroundings, and may contain, for example, a conductive nitride such as TiN, TaN, etc. The conductive body layer 1051 may be used to achieve the electrical connection between the devices, and may contain, for example, a metal such as tungsten (W), cobalt (Co), rubidium (Ru), copper (Cu), aluminum (Al), nickel (Ni), etc. The conductive barrier layer 1049 and the conductive body layer 1051 may be in contact with and connected to the first source/drain layer of the lowermost device in each device stack.

Then, the conductive barrier layer 1049 and the conductive body layer 1051 may be patterned into a conductive structure for the first source/drain layer of the lowermost device in each device stack. In this example, a part of the conductive barrier layer 1049 and a part of the conductive body layer 1051 at a bottom of the groove may be left, and a mask covering said parts may be formed.

This form of masking may be formed, for example, by the method described above in combination with FIG. 19 to FIG. 20 (B).

Figure 22:
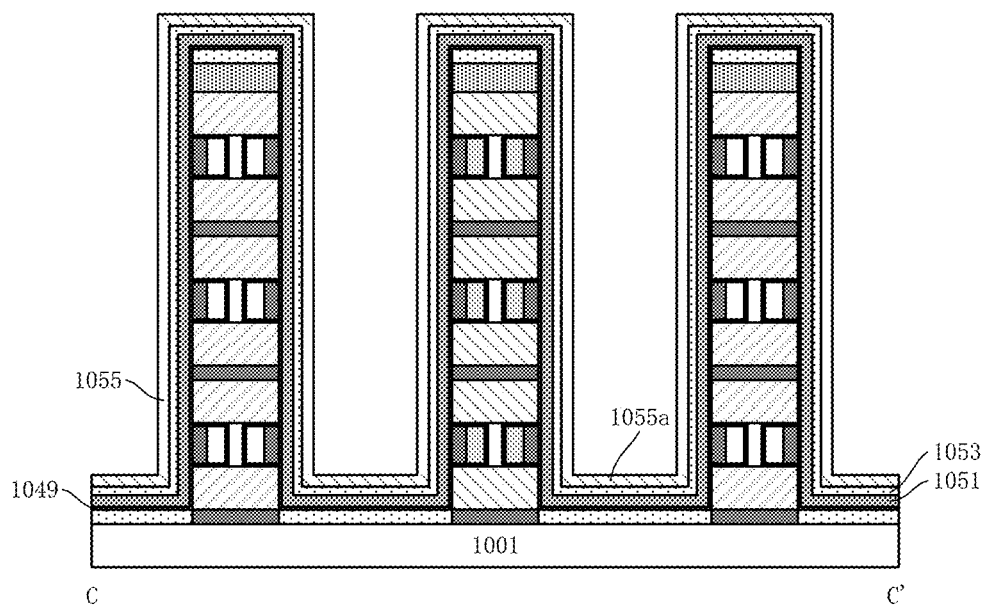
Figure 23:
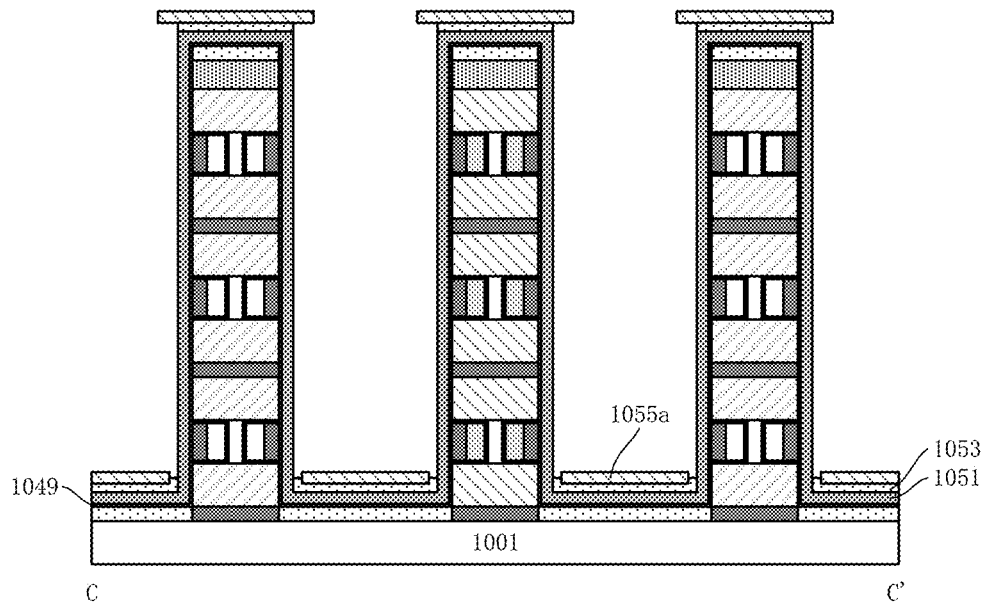

Alternatively, as shown in FIG. 22, a mask layer 1053 and a pattern auxiliary layer 1055 may be sequentially formed in a substantially conformal manner by deposition. For example, taking into account the etching selectivity, the mask layer 1053 may contain an oxide, and may have a thickness of about 1 nm to 5 nm; and for ease of a local modification (such as changing the etching selectivity), the pattern auxiliary layer 1055 may contain polysilicon or amorphous silicon, and may have a thickness of about 5 nm to 20 nm. The etching selectivity (relative to the vertically extended portion) of the pattern auxiliary layer 1055 may be changed by implanting impurities such as B in a horizontally extended portion 1055a of the pattern auxiliary layer 1055 by ion implantation in the vertical direction and annealing at, for example, about 550° C. to about 900° C. Then, as shown in FIG. 23, an undoped part of the pattern auxiliary layer 1055 may be removed by selective etching, such as wet etching using TMAH, so as to leave a doped part 1055a thereof. The mask layer 1053 may be selectively etched by using the doped pary 1055a as an etching mask, so as to obtain a mask of a desired form. In order to control an amount of etching well, ALE may be used. Thereafter, the doped part 1055a may be removed by selective etching such as ME.

Figure 24:
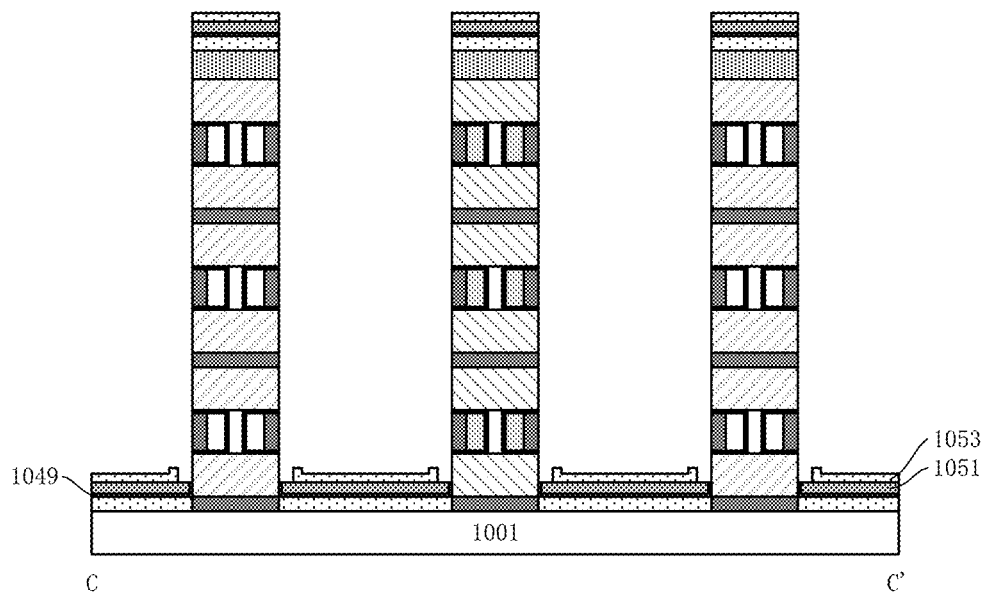

As shown in FIG. 24, the conductive barrier layer 1049 and the conductive body layer 1051 may be isotropically etched by using the mask layer 1053 as an etching mask, so that they may remain at the bottom of the groove (a part thereof may be left at the top surface of each device stack, which may be removed in a subsequent process). Here, ALE may be used to achieve a good etching control. Thereafter, the mask layer 1053 may be removed by selective etching such as RIE.

In this example, the doped part 1055a is removed before the conductive pattern is patterned. However, the present disclosure is not limited to this. For example, the doped part 1055a may be removed after the conductive pattern is patterned.

Figure 25:
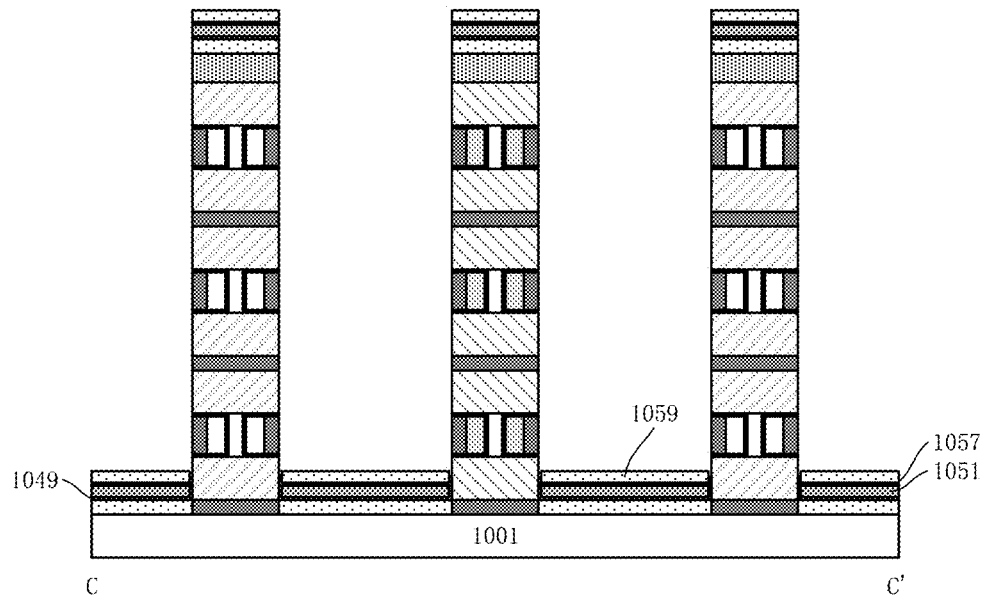

A top surface of the conductive body layer 1051 is currently exposed to the outside. To prevent a diffusion thereof, a barrier layer may be formed on the top surface. For example, as shown in FIG. 25, a conductive barrier layer 1057 may be formed in a substantially conformal manner by deposition. The conductive barrier layer 1057 may contain the same or different material as or from the conductive barrier layer 1049. Then, a mask layer 1059 such as an oxide may be formed by, for example, the method described above in combination with FIG. 22 to FIG. 24, and the conductive barrier layer 1057 may be isotropically etched by using the mask layer 1059, so that the conductive barrier layer 1057 may remain at the bottom of the groove (a part may remain on the top surface of each device stack, which may be removed in a subsequent process).

Figure 26:
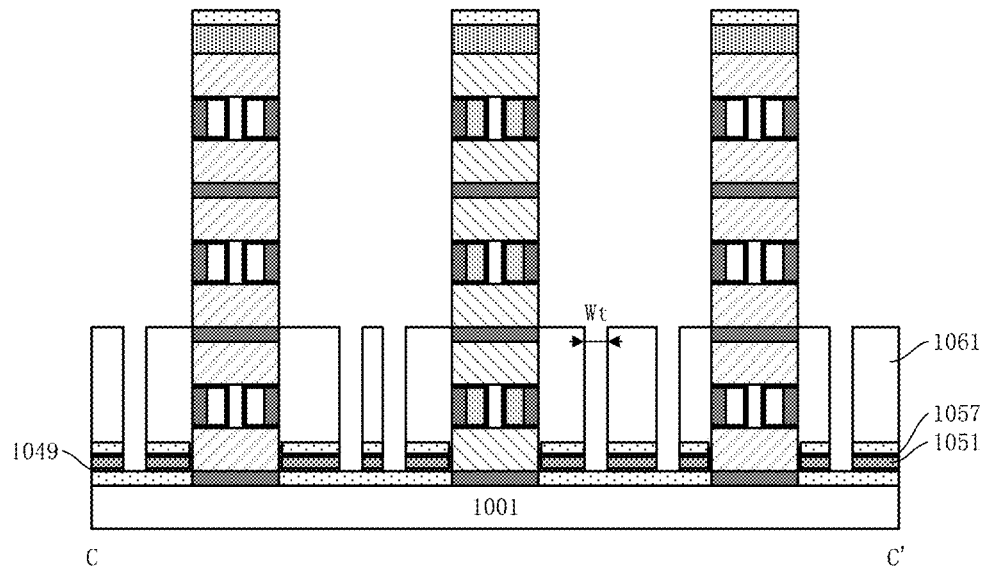

Next, the conductive body layer 1051 wrapped by the conductive barrier layers 1049 and 1057 may be patterned. A pattern positioning may be assisted based on an alignment mark of the device layer L1. For example, as shown in FIG. 26, a mask layer 1061 for patterning the conductive structure may be formed in the groove. For example, the mask layer 1061 may be formed by spin-coating and etching back a photoresist to thin the photoresist for ease of exposure, leaving the photoresist in the groove, and then patterning (e.g., photolithography or e-beam exposure, etc.) the photoresist with the assistance of the alignment mark of the device layer L1. A minimum gap Wt of each opening in the mask layer 1061 may be substantially uniform, which may help consistency of a subsequent process. To ensure such consistency, a part of the conductive structure defined by the patterned photoresist may be a dummy conductive structure.

A selective etching such as ME may be sequentially performed on the mask layer 1059, the conductive barrier layer 1057, the conductive body layer 1051 and the conductive barrier layer 1049 by using the mask layer 1061 as an etching mask. The RIE may be performed in the substantially vertical direction and may stop on the electrical isolation layer 1047" (or may slightly enter the electrical isolation layer 1047' so as to ensure that each electrical conductive layer is cut off). In this way, a laterally extended conductive structure may be formed at a height corresponding to the first source/drain layer of the device layer L1 at the bottom of the groove, and at least a part of the conductive structure is in contact with and thus electrically connected to the lowermost first source/drain layer in each device stack. In addition, due to the etching steps, a residue on the top surface of each device stack in the previous process may be removed. Thereafter, the mask layer 1061 may be removed.

Figure 27:
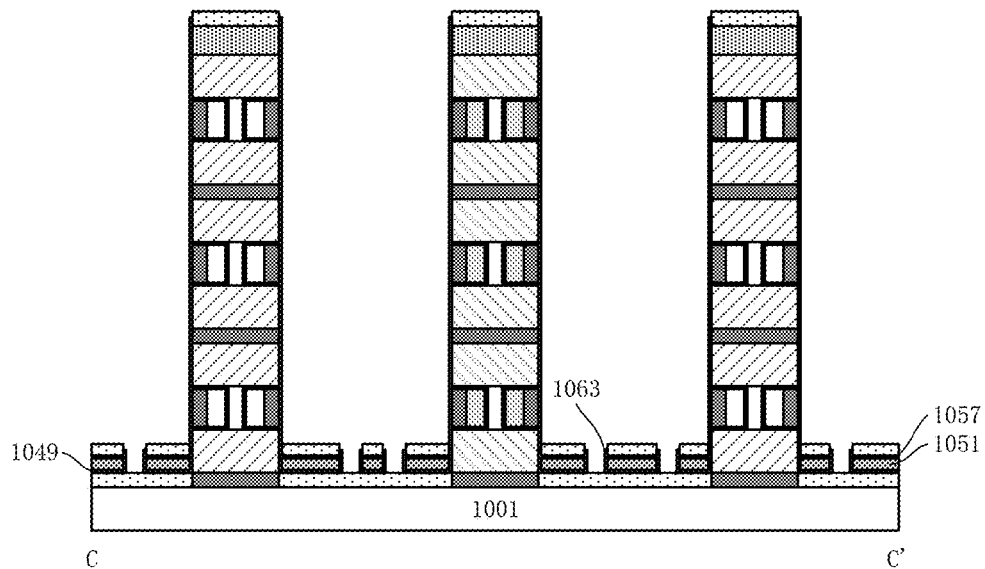

Due to such etching, a part of sidewalls of the conductive body layer 1051 is exposed to the outside. To prevent diffusion, a conductive barrier layer may be formed on the sidewall of the conductive body layer 1051. For example, as shown in FIG. 27, a conductive barrier layer 1063 may be formed in a substantially conformal manner by deposition, and through an anisotropic etching such as RIE in the vertical direction, a laterally extended portion thereof may be removed and a vertically extended portion thereof may be left, so that the conductive barrier layer 1063 may be formed in a spacer form and left on the sidewall of the conductive body layer 1051. The conductive barrier layer 1063 may contain the same or different material as or from the conductive barrier layers 1049 and 1057. In order to maintain consistency, the conductive barrier layers 1049, 1057 and 1063 may have the same material and substantially the same film thickness.

Figure 28A:
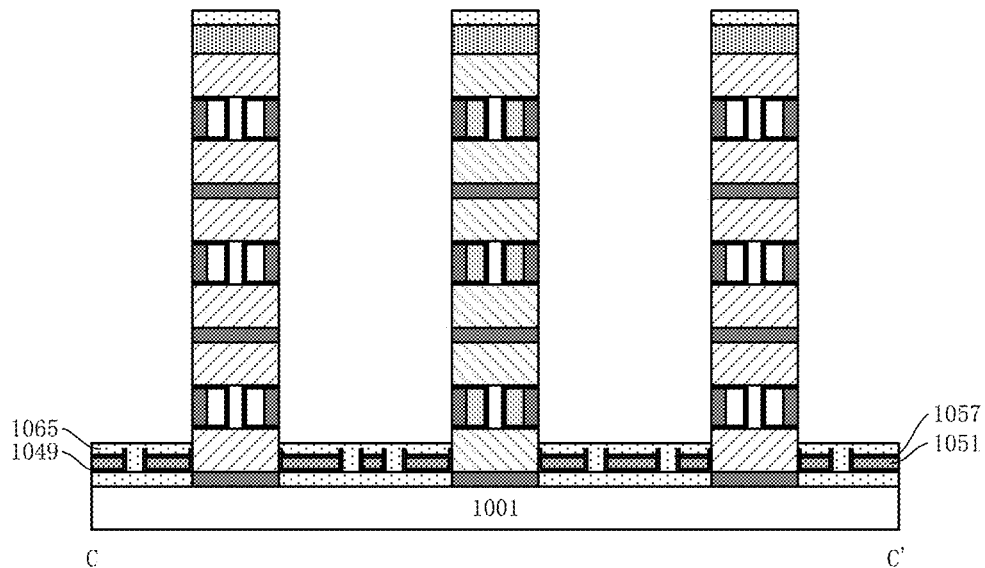
Figure 28B:
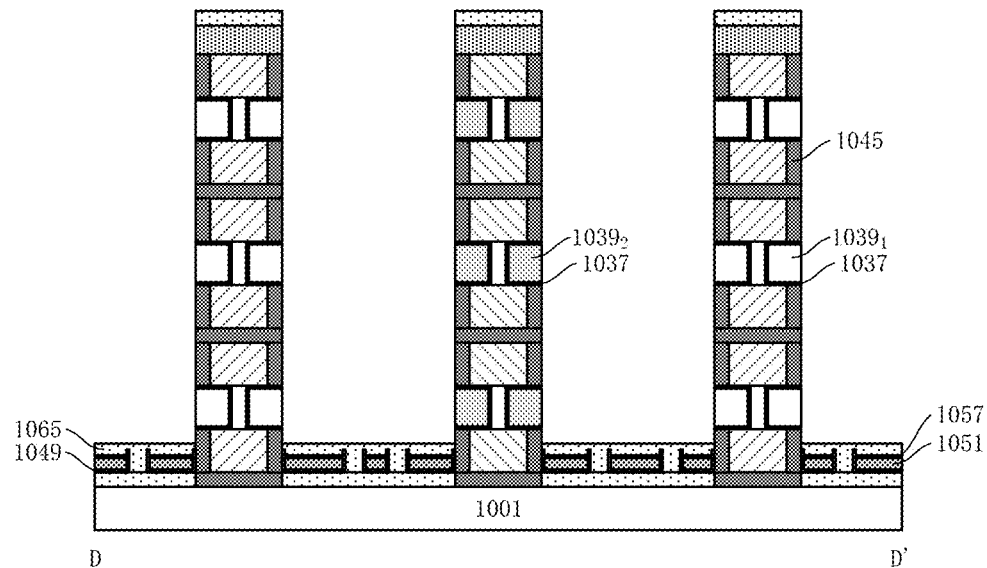

The conductive barrier layer 1063 in the spacer form only needs to cover the conductive body layer 1051. To this end, as shown in FIG. 28(A) and FIG. 28(B), a dielectric layer 1065 (e.g., an oxide) may be filled in the groove, particularly in the gap between the conductive structures. The dielectric layer 1065 may be formed by deposition and then etching back. The deposited dielectric layer 1065 may have a thickness greater than Wt/2, so that the gap between the conductive structures may be fully filled.

Since the dielectric layer 1065 is located inside the groove, it is difficult to perform a planarization process such as CMP. In order to ensure a flatness of a top surface of the dielectric layer 1065 so as to facilitate subsequent photolithography, the conductive structure may include some dummy patterns (that is, an interconnection line and/or a via hole that does not achieve an actual electrical connection) so that a minimum gap may be substantially uniform as described above. In addition, a deposited film thickness may be greater than half of the minimum gap. In order to better control the flatness of the dielectric layer 1065, Atomic Layer Deposition (ALD) may be used for deposition, and ALE may be used for etching back.

Next, a part of the conductive barrier layer 1063 exposed by the dielectric layer 1065 may be removed by selective etching, such as RIE. Then, the conductive body layer 1051 may be encapsulated by the conductive barrier layers 1049, 1057 and 1063. An interface or a boundary may exist between the conductive structure formed in this way and the device stack (e.g., the component requires to be connected, such as the source/drain region, the gate electrode, etc.) due to a material difference, a misalignment of up and down, or front and back positions, and the like. Further, an interface or a boundary may exist between the dielectric layer 1065 and the device stack (e.g., an interlayer dielectric layer therein). The dielectric layer 1065 may also form a part of the electrical isolation layer and is referred to hereinafter as the electrical isolation layer.

A layer of conductive structure is formed as above. A plurality of layers of conductive structures may be formed one by one in the same or similar manner.

Figure 29:
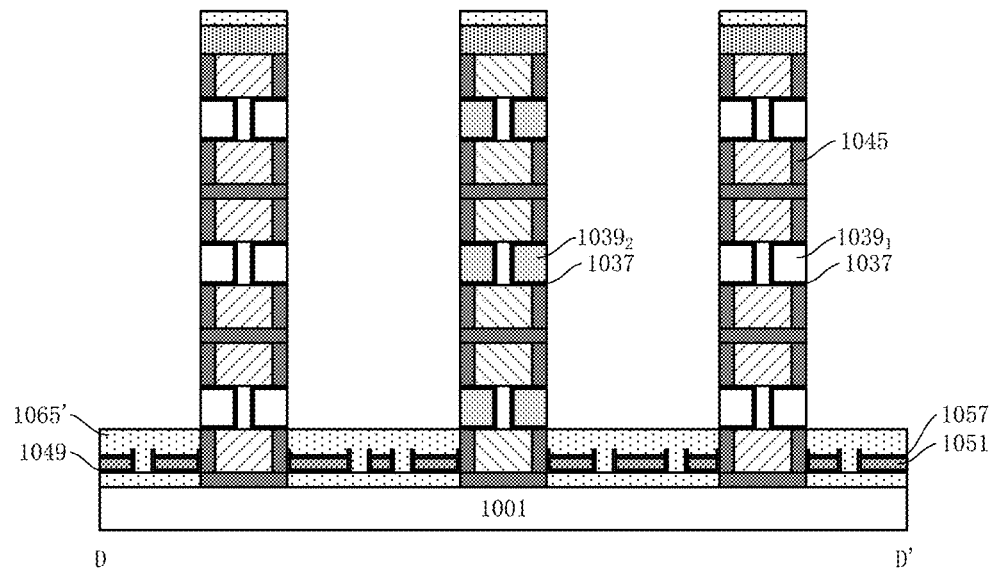

Next, for example, a conductive structure for the gate conductor layer of the lowermost device in each device stack may be formed. The conductive structure to be formed for the gate conductor layer may be located at a height corresponding to the gate conductor layer. To this end, as shown in FIG. 29, a dielectric material such as an oxide may be deposited and then etched back by, for example, the method described above in combination with FIG. 19 to FIG. 20 (B), so as to raise a top surface of the electrical isolation layer 1065 to a height corresponding to the gate conductor layer. The raised electrical isolation layer is denoted by 1065'. It should be noted that although the electrical isolation layer 1065' is shown here as a whole, an interface or a boundary may exist between successively formed layers. Here, the residue on the top surface of each device stack may be thickened (this thickening is not shown for convenience only).

Here, the height of the top surface of the electrical isolation layer 1065' may cause that, on one hand, the exposed sidewall of the first source/drain layer in the groove may be shielded so as to prevent the conductive structure subsequently formed on the top surface of the electrical isolation layer 1065' from contacting the first source/drain layer; and on the other hand, the sidewall of the gate conductor layer may be exposed in the groove so that the conductive structure subsequently formed on the top surface of the electrical isolation layer 1065' may contact the gate conductor layer.

In order to enhance a heat dissipation performance, a heat dissipation conduit may be formed in the electrical isolation layer. Here, a formation of a U-shaped heat dissipation conduit is illustrated by way of example. However, the present disclosure is not limited thereto. For example, the heat dissipation conduit may be formed in other shapes, such as a vertical line or an L-shape, etc. entering the electrical isolation layer.

Figure 30:
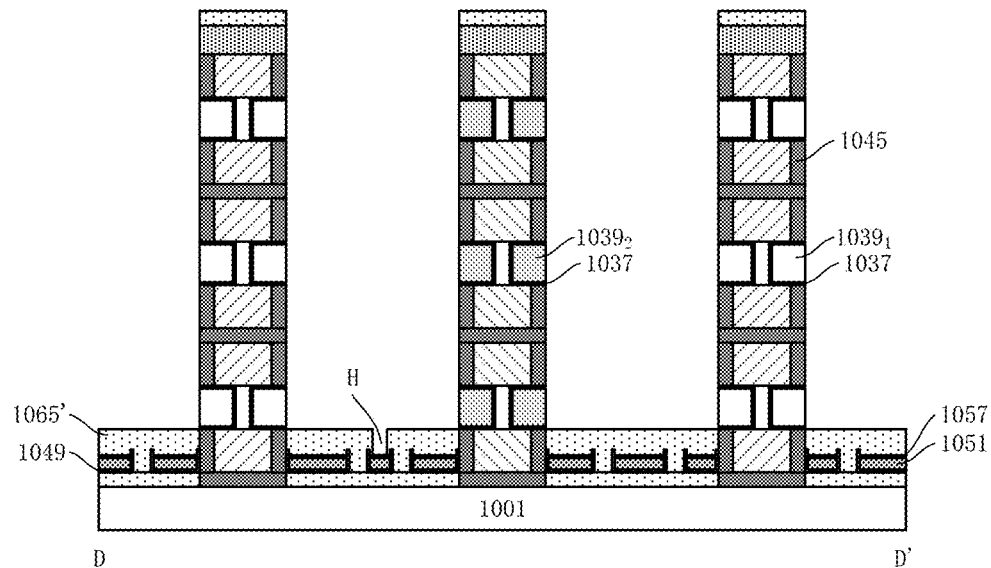

As shown in FIG. 30, in the electrical isolation layer 1065', a hole H may be formed by etching, such as RIE. Subsequently, a laterally extended conduit may be dug in the electrical isolation layer through the hole H. In addition, the hole H may be formed relatively narrow, so as to be subsequently closed without substantially affecting the laterally extended conduit.

Figure 31:
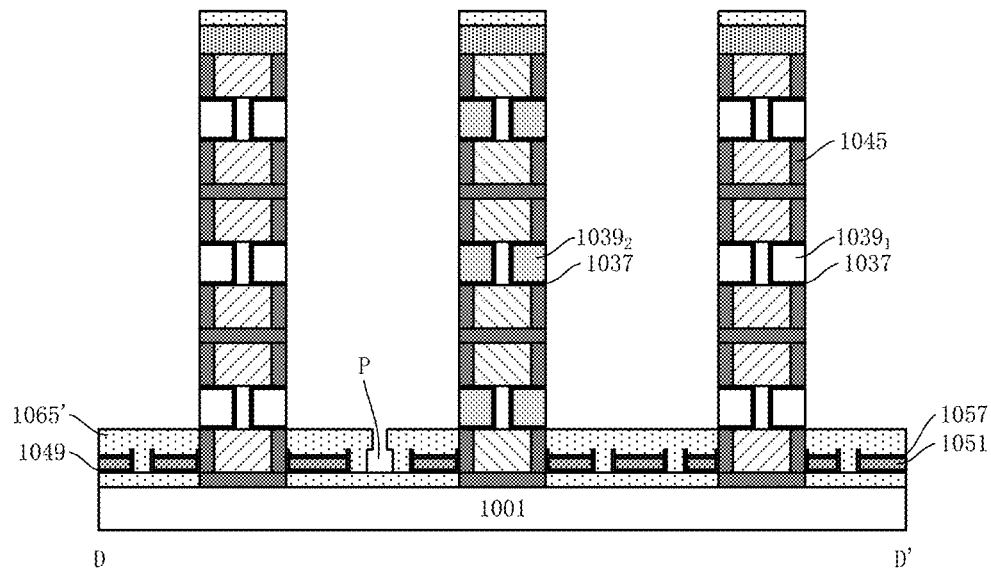

As shown in FIG. 31, the conductive structure accessible through the hole H may be removed by selective etching, such as wet etching, via the hole H. Specifically, each conductive barrier layer and each conductive body layer in the conductive structure may be selectively etched. Due to the etching selectivity, the electrical isolation layer 1065' may be substantially unaffected and thus the laterally extended conduit corresponding to the etched conductive structure may be formed therein. That is, when forming the conductive structure as described above in combination with FIG. 21 to FIG. 28(B), a dummy conductive structure for defining the laterally extended conduit may be formed. The hole H may be formed on the dummy conductive structure and may be laterally narrower than the dummy conductive structure (and the resulting laterally extended conduit).

Figure 32:
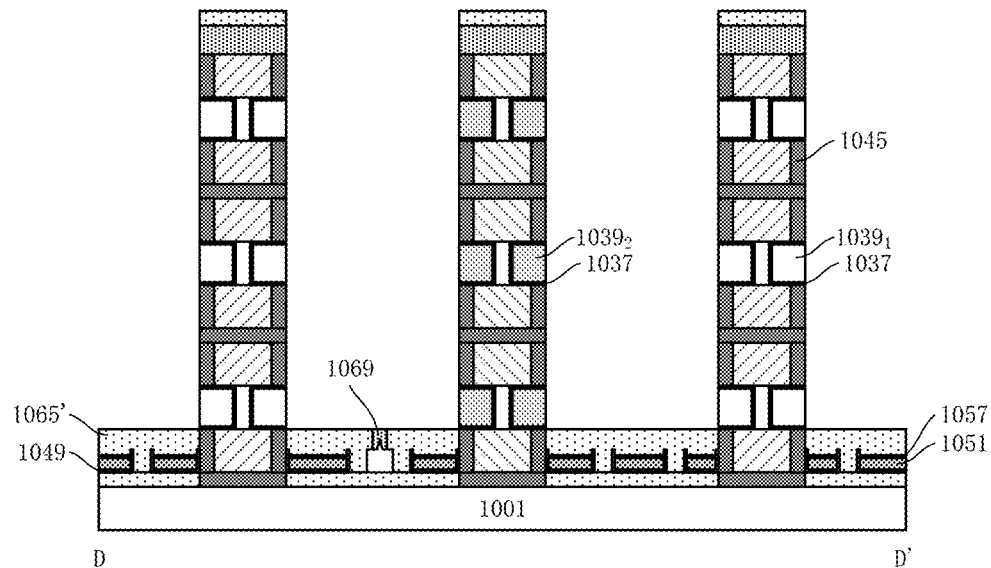

Then, as shown in FIG. 32, a plug 1069 may be formed in the hole H so as to close the hole H. For example, a plug material may be deposited by, for example, CVD, and a deposition thickness of the plug material may be controlled to be greater than half of a width of the hole H, so that the plug material may fully fill the hole H. In addition, since the hole is narrower than the laterally extended conduit, the hole may produce a bottleneck effect during the deposition, which may suppress an entry of the plug material into the laterally extended conduit, so that the laterally extended conduit is substantially free of or have little plug material therein and remain hollow. The plug material may have etching selectivity with respect to the electrical isolation layer 1065', such as a nitride. The deposited plug material may be selectively etched (e.g., to a depth approximately the same as the deposition thickness) to leave in the hole H to form the plug 1069. In order to better control the etching depth, ALE may be used.

In this example, only a single hole H and a resulting single laterally extended conduit are shown. However, the present disclosure is not limited thereto. For example, a plurality of holes may be formed, and laterally extended conduits may be formed via the holes, respectively. As described above, in order to ensure a certain flatness, the width of each hole H may be substantially uniform.

The formation of the conductive structure may then continue.

Figure 33:
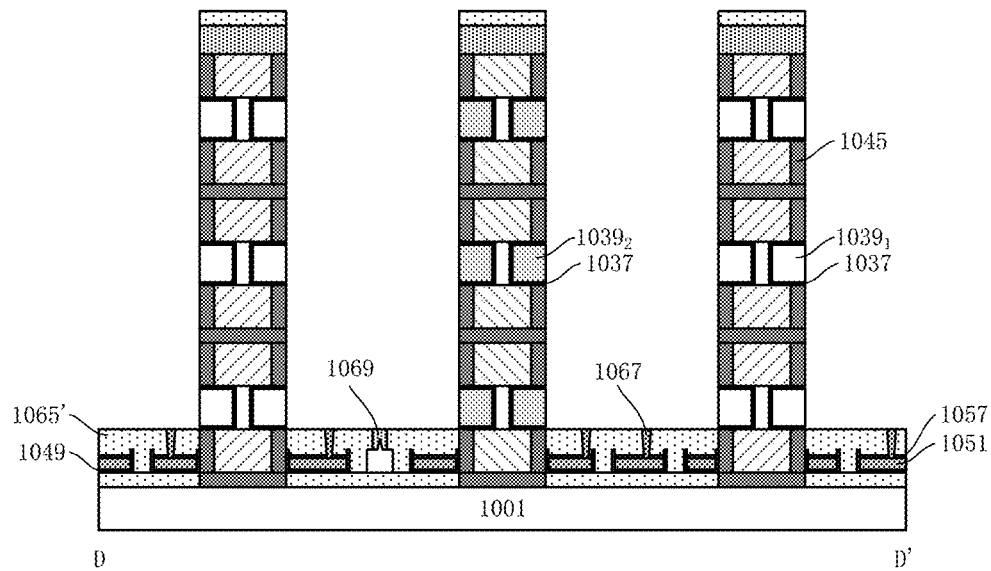

As shown in FIG. 33, in the electrical isolation layer 1065', a via hole 1067 may be formed by, for example, etching a hole and filling the hole with a conductive barrier layer such as a conductive nitride and a conductive material such as a metal. The via hole 1067 may enable an electrical connection between upper and lower layers. One or more of the via holes adjacent to the sidewall of the device stack may be in direct contact with the first source/drain layer.

Figure 34A:
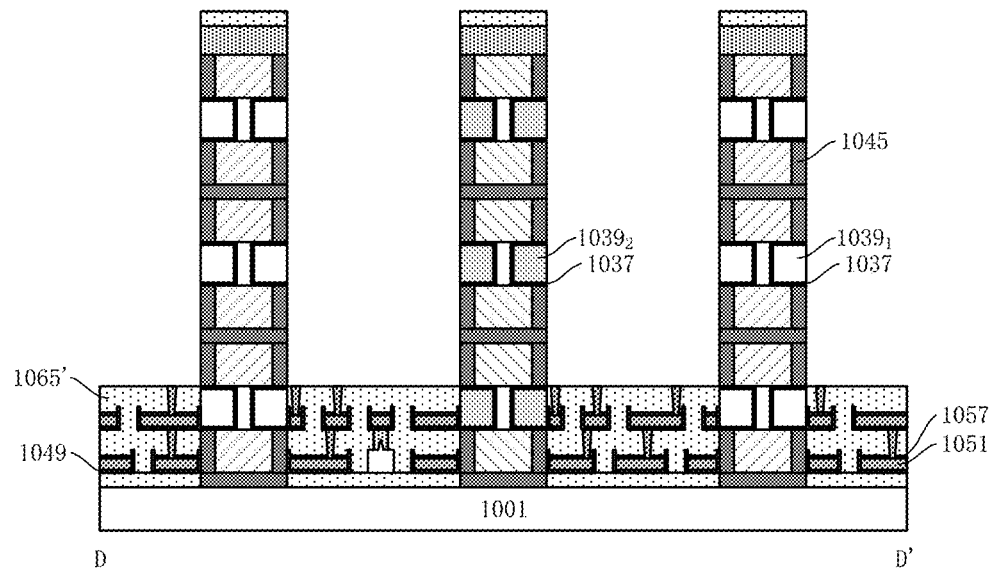
Figure 34B:
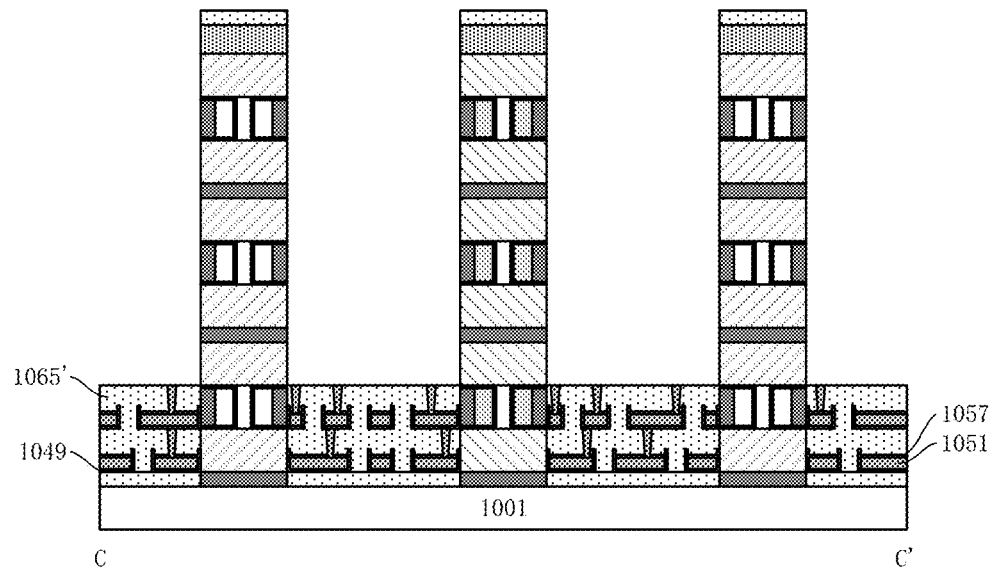

In addition, as shown in FIG. 34(A) and FIG. 34(B), a conductive structure may be formed on the electrical isolation layer 1065' as described above in combination with FIG. 21 to FIG. 28 (B). Then, the height of the electrical isolation layer 1065' may be further raised. Here, the height of the top surface of the electrical isolation layer 1065' may cause that, on one hand, the exposed sidewall of the gate conductor layer in the groove may be shielded, so as to prevent the conductive structure subsequently formed on the top surface of the electrical isolation layer 1065' from contacting the gate conductor layer, and on the other hand, the sidewall of the second source/drain layer may be exposed in the groove so that the conductive structure subsequently formed on the top surface of the electrical isolation layer 1065' may contact the second source/drain layer. Similarly, a via hole may be formed in the electrical isolation layer 1065'.

Figure 35:
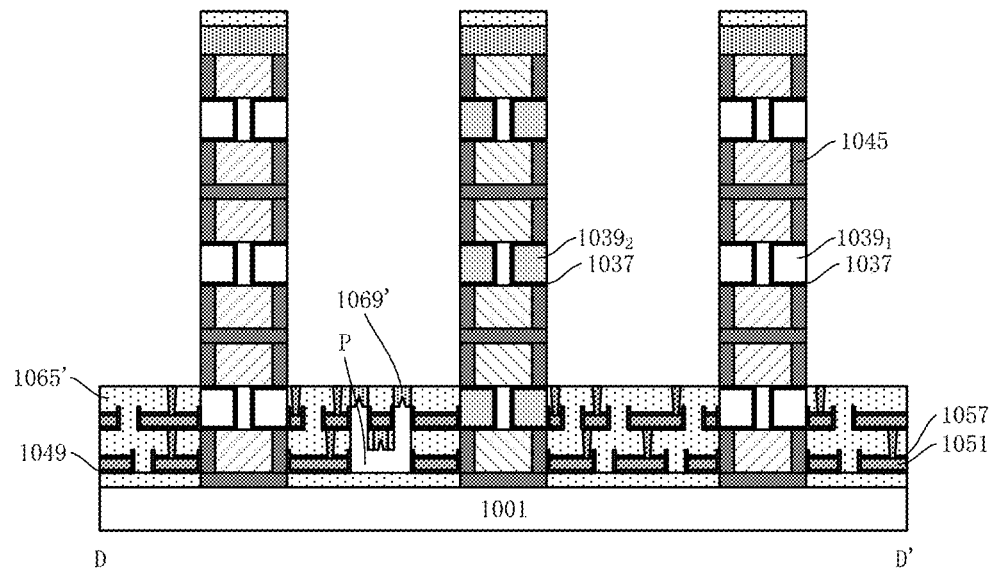

As shown in FIG. 35, a hole may be formed in the electrical isolation layer 1065', and etching such as RIE may be performed downwardly through the hole (e.g., in a substantially vertical direction), so as to form a vertically extended conduit in communication with two opposite ends of the laterally extended conduit, as described above in combination with FIG. 30. The conduits may be in communication with each other, so as to form a heat dissipation conduit P. In addition, a plug 1069' may be formed in the hole as described above in combination with FIG. 32. Here, since the vertically extended conduit is thin and deep, the plug 1069' may be formed at a top end thereof to close the vertically extended conduit, and a lower part thereof may remain hollow.

Figure 36A:
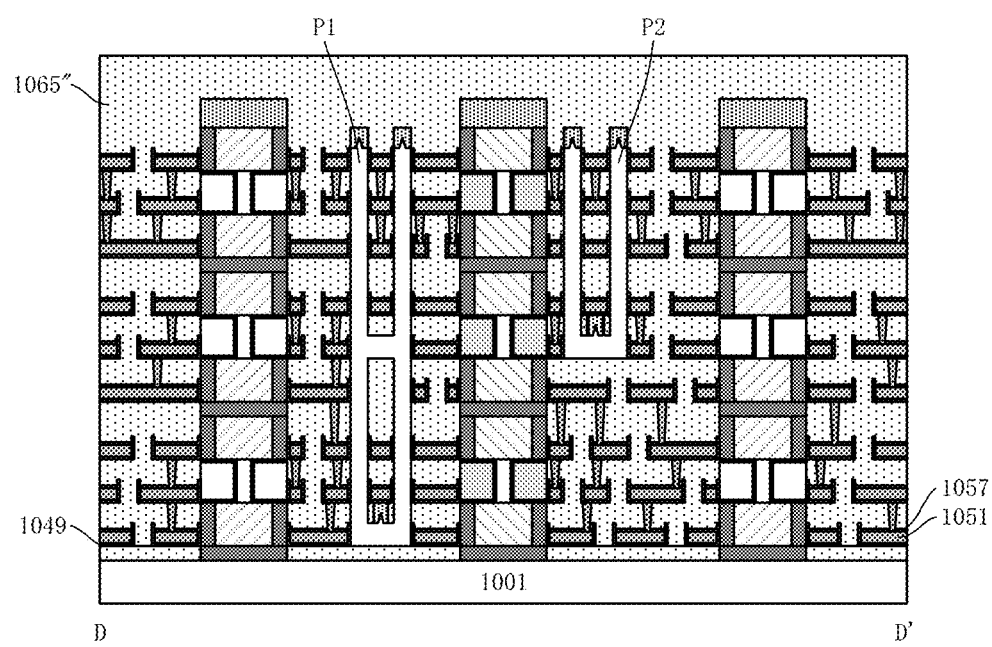
Figure 36B:
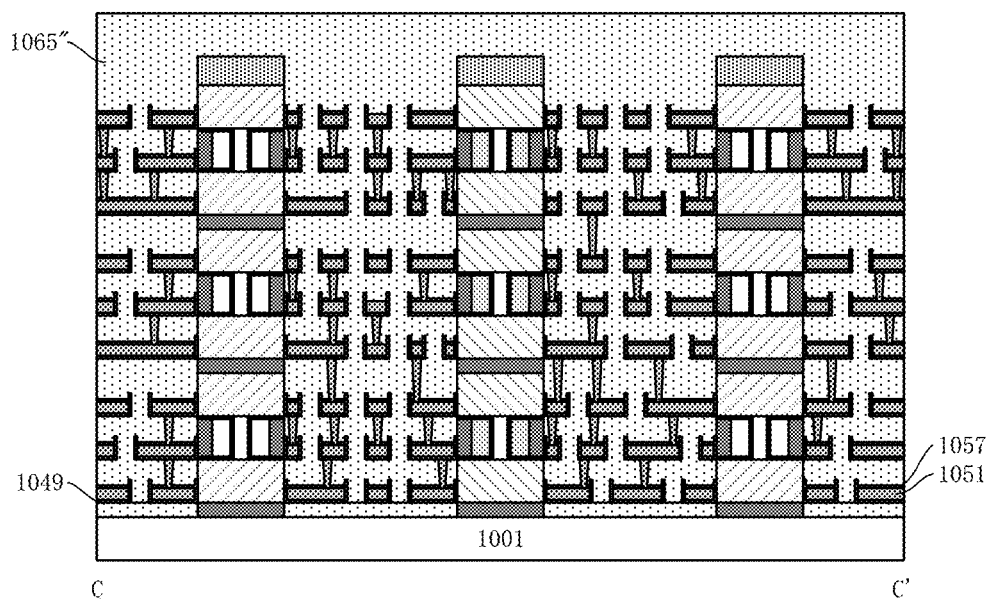

In this way, as shown in FIG. 36(A) and FIG. 36(B), the conductive structures may be formed layer by layer, so as to form an interconnection structure. Here, for the first source/drain layer, the gate conductor layer and the second source/drain layer in each device layer, corresponding conductive structures are formed at corresponding heights to achieve the required interconnections. In FIG. 36(A) and FIG. 36(B), the electrical isolation layer between the conductive structures in the interconnection structure is shown as 1065". At least a part of the aforementioned interfaces or boundaries in the layers may be substantially coplanar, e.g., substantially aligned in the vertical direction.

In addition, heat dissipation conduits P1 and P2 may be formed in the electrical isolation layer 1065" in the manner described above. In this example, the heat dissipating conduits P1 and P2 have vertically extended conduits and laterally extended conduit extending between the vertically extended conduits. The number of the laterally extended conduit between the vertically extended conduits is not limited to 1, but may be more (for example, P1 is shown with two laterally extended conduits). More or fewer heat dissipation conduits may be provided in the electrical isolation layer 1065" as desired, and at least some of the heat dissipation conduits may have a different dimension, e.g. different depths, thicknesses, laterally extending conduit lengths, etc.

The vertically extended conduit may also be formed by vertical etching after the electrical isolation layer 1065" is achieved. In the embodiments described above, the vertically extended conduit is formed in sections, which may avoid a difficulty of etching a deep and thin hole. After each section of the vertically extending conduit is formed, a top portion of the section is closed by a plug, and when a latter section of the conduit is etched, the plug in the previous section may be etched as well, so that the previous section and the latter section may be communicated.

The top portions of the formed heat dissipation conduits P1 and P2 may have plugs to prevent the heat dissipation conduits from being affected when the interlayer dielectric layer is formed subsequently.

Figure 37:
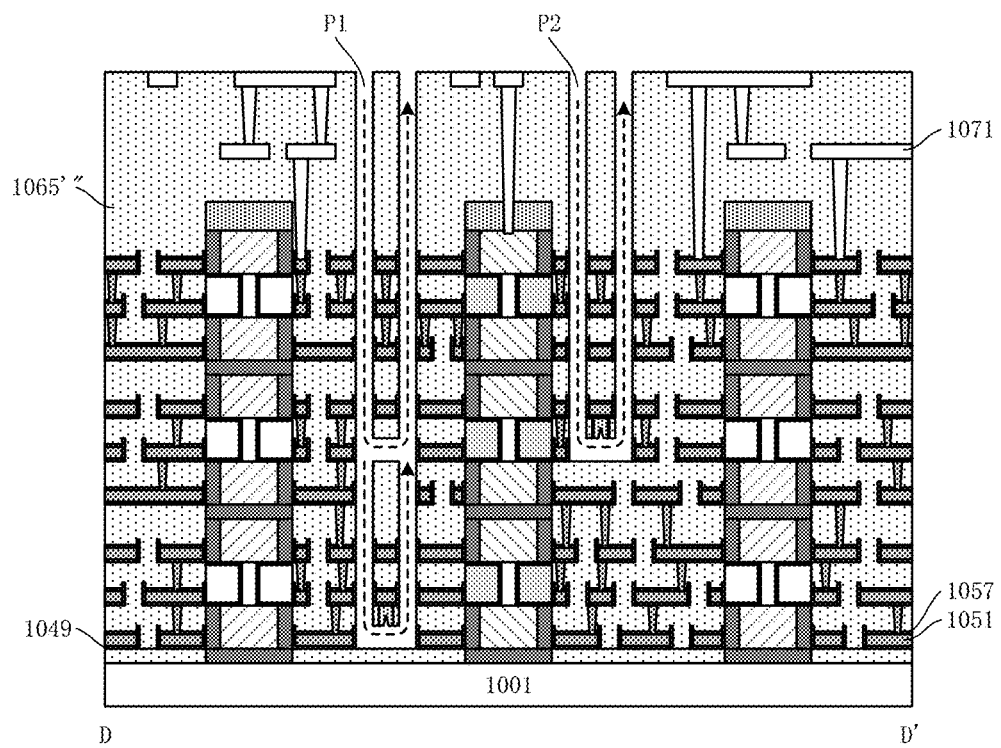

After that, a leading-out terminal of the interconnection structure may be manufactured. For example, as shown in FIG. 37, an interlayer dielectric layer (shown here as 1065''' integrally with the electrical isolation layer) may be formed by, for example, depositing and planarizing a dielectric material such as an oxide, and an interconnection structure 1071 such as an interconnection line or a via hole may be formed in the interlayer dielectric layer 1065'''. The interconnection structure 1071 may be in contact with and electrically connected to an interconnection structure previously formed in the groove.

In addition, a vertical conduit in communication with the previously formed heat dissipation conduits P1 and P2 may be formed in the interlayer dielectric layer 1065" by etching such as RIE. These conduits in communication (still shown as P1 and P2 for convenience only) may form the heat dissipation conduits, as indicated by arrowed dotted lines shown in FIG. 37. According to the embodiment, a coolant such as a pressurized cold gas and/or a liquid may be introduced from one end of the heat dissipation conduits P1 and P2 and led out from the other end, so that a heat from the device may be dissipated more efficiently.

In the above embodiments, the isolation layer is provided between adjacent device layers. However, the present disclosure is not limited to this. For example, some device layers may be directly adjacent to each other, particularly in a case of a Complementary Metal Oxide Semiconductor (CMOS) process.

According to the embodiments of the present disclosure, for the semiconductor device, especially the vertical semiconductor device, the sidewall interconnection structure laterally adjacent thereto may be provided, which may reduce the photolithography step in the manufacturing process and reduce manufacturing costs. Manufacturing process steps may be shared between stacked (vertical) semiconductor devices, so that the manufacturing costs may be reduced. In addition, a three-dimensional construction may allow more space for the interconnection between devices and thus may have a low resistance and a high bandwidth. Due to an existence of the sidewall interconnection structure, the semiconductor apparatus may have a leading-out terminal.

Therefore, the manufacture of the semiconductor apparatus may be separated from the manufacture of a metallization stacked layer, so that a chip similar to a Field Programmable Gate Array (FPGA) may be obtained. In the sidewall interconnection structure, the heat dissipation conduit may be embedded to enhance a heat dissipation performance.

The semiconductor apparatus according to the embodiments of the present disclosure may be applied to various electronic devices. Accordingly, the present disclosure further provides an electronic device including the semiconductor apparatus described above. The electronic device may further include a display screen, a wireless transceiver and other components. The electronic device may include, for example, a smart phone, a personal computer (PC), a tablet computer, an artificial intelligence device, a wearable device, a portable power source, and so on.

According to the embodiments of the present disclosure, a method of manufacturing a system on chip (SoC) is further provided, which may include the method described above. Specifically, a variety of devices may be integrated on the chip, at least some of which are manufactured according to the method of the present disclosure.

In the above descriptions, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above respectively, it does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor apparatus, comprising:
   a carrier substrate having a first region and a second region adjacent to each other;
   a semiconductor device on the first region; and
   an interconnection structure on the second region, wherein the interconnection structure comprises:
   an electrical isolation layer;
      a conductive structure in the electrical isolation layer, wherein at least a part of components require to be electrically connected in the semiconductor device is in contact with and therefore electrically connected to the conductive structure in a lateral direction, wherein the conductive structure is located at a corresponding height in the interconnection structure; and
      a heat dissipation conduit in the electrical isolation layer.

2. The semiconductor apparatus according to claim 1, wherein the heat dissipation conduit is in communication with an outside.

3. The semiconductor apparatus according to claim 2, wherein the heat dissipation conduit is configured to guide a gas and/or a liquid to flow through the heat dissipation conduit.

4. The semiconductor apparatus according to claim 1, wherein the carrier substrate further has a third region adjacent to the second region, and the semiconductor apparatus further comprises:
   a semiconductor device on the third region, wherein at least a part of components require to be electrical connected in the semiconductor device on the third region is in contact with and therefore electrically connected to the conductive structure in the lateral direction, wherein the conductive structure is located at a corresponding height in the interconnection structure.

5. The semiconductor apparatus according to claim 1, wherein the heat dissipation conduit comprises a first vertically extended portion, a second vertically extended portion, and a laterally extended portion connecting the first vertically extended portion and the second vertically extended portion.

6. The semiconductor apparatus according to claim 5, wherein the interconnection structure further comprises a plug provided on the laterally extended portion, and the plug has etching selectivity with respect to the electrical isolation layer.

7. The semiconductor apparatus according to claim 6, wherein the plug is narrower than the laterally extended portion in the lateral direction.

8. The semiconductor apparatus according to claim 5, wherein the heat dissipation conduit comprises a plurality of laterally extended portions connecting the first vertically extended portion and the second vertically extended portion.

9. The semiconductor apparatus according to claim 5, wherein a plurality of heat dissipation conduits are provided, and at least a part of the heat dissipation conduits has different dimensions.

10. The semiconductor apparatus according to claim 9, wherein the dimension comprises at least one of a depth of the heat dissipation conduit, a thickness of the heat dissipation conduit, and a length of the laterally extended portion.

11. The semiconductor apparatus according to claim 1, wherein the heat dissipation conduit surrounds one or more conductive structures in the interconnection structure.

12. The semiconductor apparatus according to claim 1, wherein an interface exists between the component and the conductive structure.

13. The semiconductor apparatus according to claim 12, wherein at least a part of the interfaces at different heights is substantially coplanar.

14. The semiconductor apparatus according to claim 1, wherein an interface exists between the electrical isolation layer and an interlayer dielectric layer in the first region.

15. The semiconductor apparatus according to claim 1, wherein the interconnection structure further comprises a dummy conductive structure, and a minimum spacing between conductive structures in a layer, a minimum spacing between a conductive structure and a dummy conductive structure in the layer and a minimum spacing between dummy conductive structures in the layer are substantially uniform in the layer.

16. An electronic device comprising the semiconductor apparatus according to claim 1.

17. The electronic device according to claim 16, wherein the electronic device comprises a smart phone, a personal computer, a tablet computer, an artificial intelligence device, a wearable device, or a portable power source.

18. A method of manufacturing a semiconductor apparatus, comprising:
   providing a device stack on a carrier substrate;

forming, in a region adjacent to the device stack on the carrier substrate, an interconnection structure laterally adjacent to the device stack, wherein the interconnection structure comprises an electrical isolation layer and a conductive structure in the electrical isolation layer, and a height of the conductive structure in the interconnection structure is controlled in forming the interconnection structure, so that at least a part of components require to be electrically connected in the device stack is in contact with and therefore electrically connected to the conductive structure in a lateral direction, and the conductive structure is located at a corresponding height in the interconnection structure; and forming a heat dissipation conduit in the electrical isolation layer.

19. The method according to claim 18, wherein the heat dissipation conduit is formed as a conduit with two ends open.

20. The method according to claim 18, wherein the forming a heat dissipation conduit comprises:

forming a first conductive structure at a first height in the region, wherein the first height enables the first conductive structure to be located at substantially the same height as a corresponding component;

forming a first dielectric material in the region so as to bury the first conductive structure, wherein a top surface of the first dielectric material is located at a second height, wherein the second height enables a second conductive structure subsequently formed on the first dielectric material to be located at substantially the same height as a corresponding component;

forming a first opening with a first width in the first dielectric material;

forming a lateral channel under the first opening by etching through the first opening, wherein the lateral channel has a second width greater than the first width;

forming a first plug in the first opening;

forming a second conductive structure on the first dielectric material;

forming a second dielectric material in the region, wherein a top surface of the second dielectric material is located at a third height;

forming a second opening in the second dielectric material; and forming vertical channels in communication with two opposite ends of the lateral channel by etching through the second opening.

21. The method according to claim 20, wherein the forming a first plug comprises:

depositing a plug material with a thickness greater than half of the first width, so as to fully fill the first opening without substantially filling the lateral channel; and etching the plug material, so that the plug material is left in the first opening to form the first plug.

22. The method according to claim 21, wherein the deposition comprises a chemical vapor deposition, and the etching comprises an atomic layer etching.

23. The method according to claim 20, wherein the third height enables a third conductive structure subsequently formed on the second dielectric material to be located at substantially the same height as a corresponding component, and the method further comprises:

forming a second plug in the second opening;

forming the third conductive structure on the second dielectric material;

forming a third dielectric material in the region;

forming a third opening in the third dielectric material; and etching through the third opening, so that the third opening is in communication with the vertical channel.

24. The method according to claim 20, wherein the forming a lateral channel comprises:

etching a part of the first conductive structure through the second opening.

* * * * *